(12) United States Patent
Negoro et al.

(10) Patent No.: US 12,545,839 B2
(45) Date of Patent: Feb. 10, 2026

(54) SUBSTRATE PROCESSING METHOD AND SUBSTRATE PROCESSING APPARATUS

(71) Applicant: SCREEN Holdings Co., Ltd., Kyoto (JP)

(72) Inventors: Sei Negoro, Kyoto (JP); Kenji Kobayashi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 244 days.

(21) Appl. No.: 18/043,320

(22) PCT Filed: Jul. 21, 2021

(86) PCT No.: PCT/JP2021/027400
§ 371 (c)(1),
(2) Date: Feb. 27, 2023

(87) PCT Pub. No.: WO2022/044639
PCT Pub. Date: Mar. 3, 2022

(65) Prior Publication Data
US 2023/0323205 A1    Oct. 12, 2023

(30) Foreign Application Priority Data
Aug. 31, 2020 (JP) ................. 2020-146098

(51) Int. Cl.
*C09K 13/00* (2006.01)
*H01L 21/306* (2006.01)
(Continued)

(52) U.S. Cl.
CPC ........ *C09K 13/00* (2013.01); *H01L 21/30608* (2013.01); *H01L 21/32134* (2013.01); *H01L 21/6708* (2013.01)

(58) Field of Classification Search
CPC ... C09K 13/00; C09K 13/02; H01L 21/30608; H01L 21/32134; H01L 21/6708
(Continued)

(56) References Cited

U.S. PATENT DOCUMENTS 9,362,106 B2    6/2016  Iwamoto et al.
11,670,517 B2 *  6/2023  Negoro ............. H01L 21/68764
                                                    438/694
(Continued)

FOREIGN PATENT DOCUMENTS

JP    2013-254898 A    12/2013
JP    2018-019089 A     2/2018
(Continued)

OTHER PUBLICATIONS

JP 2020126997-A English language translation (Year: 2020).*
(Continued)

*Primary Examiner* — Anita K Alanko
(74) *Attorney, Agent, or Firm* — OSTROLENK FABER LLP

(57) ABSTRACT

According to the present invention, a substrate W is provided with a recess 95. The width of the recess 95 is smaller than the depth of the recess 95. An etching target which is at least one of a single crystal of silicon, a polysilicon and an amorphous silicon is exposed in at least a part of the upper part of a lateral surface 95s and in at least a part of the lower part of the lateral surface 95s. The etching target is etched by supplying an alkaline first etching liquid, in which an inert gas is dissolved, to the substrate W. The etching target is etched by supplying an alkaline second etching liquid, in which a dissolution gas is dissolved, and which has a dissolved oxygen concentration higher than that of the first etching liquid, to the substrate W before or after the first etching liquid is supplied to the substrate W.

6 Claims, 11 Drawing Sheets

(51) Int. Cl.
*H01L 21/3213* (2006.01)
*H01L 21/67* (2006.01)

(58) Field of Classification Search
USPC .............................................. 252/79.1–79.5
See application file for complete search history.

(56) References Cited

U.S. PATENT DOCUMENTS

| | | | |
|---|---|---|---|
| 2014/0080312 | A1 | 3/2014 | Iwamoto et al. |
| 2017/0141005 | A1 | 5/2017 | Printz et al. |
| 2017/0294323 | A1 | 10/2017 | Miura et al. |
| 2019/0067122 | A1 | 2/2019 | Cheng et al. |
| 2019/0091640 | A1* | 3/2019 | Nishide ............. H01L 21/32134 |
| 2019/0221450 | A1 | 7/2019 | Negoro et al. |
| 2020/0248076 | A1 | 8/2020 | Seike et al. |
| 2021/0057235 | A1 | 2/2021 | Negoro et al. |
| 2021/0313191 | A1 | 10/2021 | Negoro et al. |

FOREIGN PATENT DOCUMENTS

| | | | |
|---|---|---|---|
| JP | 2018-534783 A | | 11/2018 |
| JP | 6435385 B2 * | 12/2018 | ............ B01F 1/0038 |
| JP | 2019-125660 A | | 7/2019 |
| JP | 2020-038956 A | | 3/2020 |
| JP | 2020126997 A * | | 8/2020 |
| KR | 10-2020-0096740 A | | 8/2020 |
| TW | 201535510 A | | 9/2015 |
| TW | 1515775 B | | 1/2016 |
| TW | 201914032 A | | 4/2019 |
| TW | 202013480 A | | 4/2020 |
| TW | I695055 B | | 6/2020 |

OTHER PUBLICATIONS

International Search Report mailed Oct. 12, 2021 in corresponding PCT International Application No. PCT/JP2021/027400.
International Preliminary Report on Patentability (Chapter I) mailed Mar. 9, 2023 with Notification from the International Bureau (Form PCT/IB/326) for corresponding International Application No. PCT/JP2021/027400 in Japanese.
English translation of the International Preliminary Report on Patentability (Chapter I) mailed Mar. 9, 2023 with Notification from the International Bureau (Form PCT/IB/338) for corresponding International Application No. PCT/JP2021/027400.

* cited by examiner

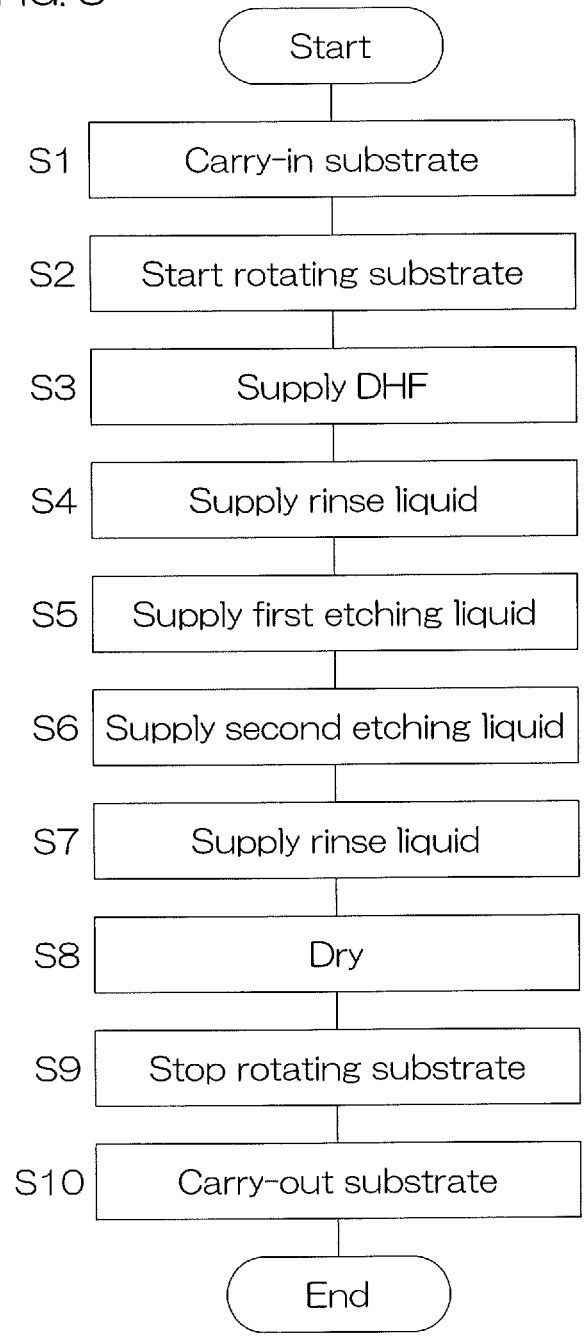

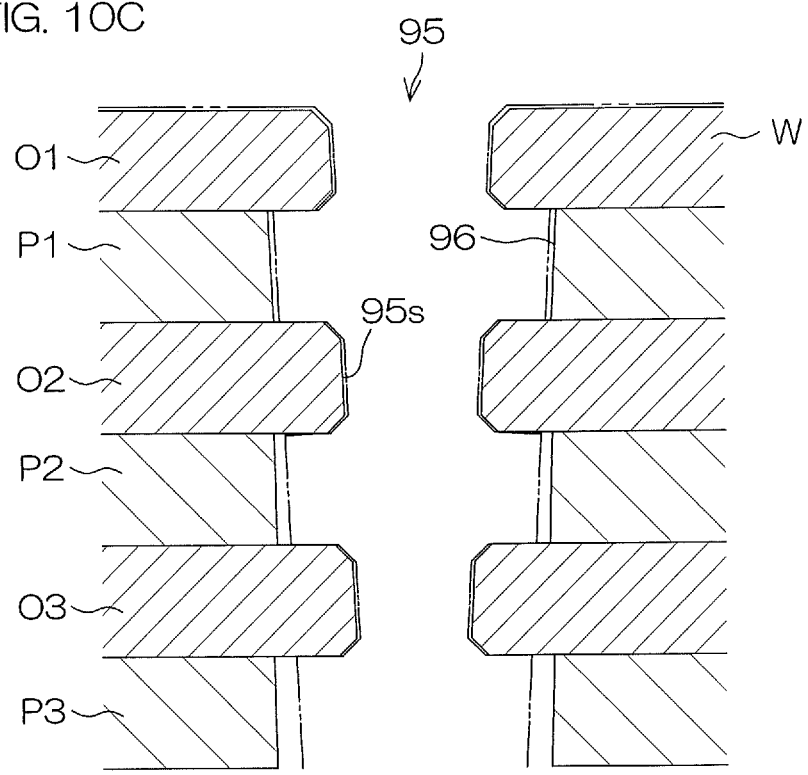

SUBSTRATE PROCESSING METHOD AND SUBSTRATE PROCESSING APPARATUS

CROSS-REFERENCE TO RELATED APPLICATIONS

The present application is a 35 U.S.C. §§ 371 national stage application of International Application No. PCT/JP2021/027400 filed Jul. 21, 2021, which claims priority to Japanese Patent Application No. 2020-146098, filed Aug. 31, 2020, the contents of which are incorporated herein by reference.

TECHNICAL FIELD

This application claims the benefit of priority to Japanese Patent Application No. 2020-146098 filed on Aug. 31, 2020. The entire contents of these applications are hereby incorporated herein by reference.

The present invention relates to a substrate processing method and a substrate processing apparatus that process a substrate. Examples of substrates include a semiconductor wafer, a substrate for a flat panel display (FPD) such as a liquid crystal display and an organic electroluminescence (organic EL) display, a substrate for an optical disc, a substrate for a magnetic disc, a substrate for a magneto-optical disc, a substrate for a photomask, a ceramic substrate, a substrate for a solar cell, and the like.

BACKGROUND ART

In a manufacturing process of semiconductor devices, FPDs, etc., alkaline etching liquid such as TMAH (tetramethyl ammonium hydroxide) or KOH (potassium hydroxide) may be supplied to a substrate such as a semiconductor wafer or a glass substrate for a FPD. Patent Literature 1 discloses etching a polysilicon film formed on a substrate by supplying the substrate with TMAH. It is disclosed that the dissolved oxygen concentration of TMAH is adjusted to the optimum concentration by dissolving nitrogen gas or dry air in TMAH.

CITATION LIST

Patent Literature

Patent Literature 1: JP 2018-19089 A

SUMMARY OF INVENTION

Technical Problem

Patent Literature 1 discloses etching the polysilicon film formed on the outermost layer of the substrate by supplying TMAH, but does not disclose whether or not a pattern is formed on the outermost layer of the substrate. Additionally, Patent Literature 1 discloses supplying TMAH to a plurality of substrates while changing the dissolved oxygen concentration of TMAH, but does not disclose supplying TMAH having different dissolved oxygen concentrations to the same substrate.

In a manufacturing process of semiconductor devices, etc., a front surface of the substrate on which a pattern such as recess formed may be supplied with alkaline etching liquid such as TMAH, and a side surface of the recess may be etched. In such cases, it may be required to intentionally etch the side surface of the recess non-uniformly instead of etching the side surface of the recess uniformly. This requirement usually includes reducing the increase in processing time. Patent Document 1 does not disclose or suggest a method and apparatus that meet such requirements.

Thus, an object of the present invention is to provide a substrate processing method and a substrate processing apparatus that are able to intentionally etch the side surface of the recess non-uniformly while reducing the processing time.

Solution to Problem

A preferred embodiment of the present invention provides a substrate processing method to process a substrate on which a recess is formed, the recess having a width shorter than a depth of the recess, the recess including an etching target that represents at least one of silicon single crystal, polysilicon and amorphous silicon and that is exposed on at least a portion of an upper portion of a side surface of the recess and at least a portion of a lower portion of the side surface, the substrate processing method including a first etching step of etching the etching target exposed on the side surface of the recess by supplying the substrate with alkaline first etching liquid in which inert gas is dissolved, and a second etching step of etching the etching target exposed on the side surface of the recess by supplying the substrate with alkaline second etching liquid in which dissolution gas is dissolved and having dissolved oxygen concentration higher than that of the first etching liquid.

In this method, the alkaline first etching liquid in which the inert gas is dissolved is supplied to the substrate. Thus, the side surface of the recess formed on the substrate is etched. Similarly, the alkaline second etching liquid in which the dissolution gas is dissolved is supplied to the substrate. Thus, the side surface of the recess formed on the substrate is etched. Accordingly, the side surface of the recess is etched step by step by supplying the first etching liquid and supplying the second etching liquid.

The etching target representing at least one of silicon single crystal, polysilicon and amorphous silicon is exposed on the at least a portion of the upper portion of the side surface of the recess and the at least a portion of the lower portion of the side surface of the recess. When liquid having high dissolved oxygen concentration is supplied to the etching target, the surface layer of the etching target changes to silicon oxide. Silicon oxide is not etched or hardly etched by alkaline etching liquid.

Dissolved oxygen present in the first etching liquid has been removed from the first etching liquid by dissolution of the inert gas. Since the dissolved oxygen concentration of the first etching liquid is low, even if the first etching liquid comes into contact with the etching target, the etching target is not oxidized or hardly oxidized. Thus, it is possible to uniformly etch the etching target exposed on the side surface of the recess at a high etching speed by supplying the substrate with the first etching liquid.

On the other hand, since the dissolved oxygen concentration of the second etching liquid is higher than the dissolved oxygen concentration of the first etching liquid, if the second etching liquid comes into contact with the etching target, the surface layer of the etching target is oxidized and changes to silicon oxide which is not easily corroded by the second etching liquid. However, the entire region of the surface layer of the etching target is not uniformly oxidized, but is non-uniformly oxidized.

That is, since the width of the recess is narrow, when the second etching liquid is supplied to the recess, the dissolved oxygen contained in the second etching liquid comes into contact with the etching target near the entrance of the recess and oxidizes the etching target. Thus, although the amount is small, the second etching liquid that has been lowered in dissolved oxygen concentration flows toward the bottom of the recess. Even at a position slightly away from the entrance of the recess, dissolved oxygen in the second etching liquid comes into contact with the etching target and is consumed. As a result of such a phenomenon being repeated continuously, the dissolved oxygen concentration of the second etching liquid decreases as the bottom of the recess is approached.

If positions in the depth direction of the recess are the same, the etching target is uniformly etched by the second etching liquid. However, the etching amount of the etching target increases as the bottom of the recess is approached. That is, since the surface layer of the etching target has changed to silicon oxide near the entrance of the recess, the etching target is less likely to be etched by the second etching liquid. On the other hand, since the surface layer of the etching target is not changed or is hardly changed to silicon oxide near the bottom of the recess, the etching target is etched by the second etching liquid. Thus, the etching amount of the etching target near the bottom of the recess is greater than the etching amount of the etching target near the entrance of the recess.

As described above, it is possible to uniformly etch the etching target exposed on the side surface of the recess at a high etching speed by supplying the substrate with the first etching liquid. Further, it is possible to etch the etching target so that the etching amount increases stepwise or continuously as the bottom of the recess is approached by supplying the substrate with the second etching liquid. Thus, it is possible to intentionally etch the side surface of the recess non-uniformly while reducing the increase in processing time by separately supplying the first etching liquid and the second etching liquid to the substrate.

The recess formed on the substrate may be a hole or a groove. That is, the side surface of the recess may be a cylindrical surface continuous over the entire circumference, or may be one or both of a pair of side surfaces facing in parallel. The recess may be recessed in the thickness direction of the substrate, or may be recessed in the surface direction of the substrate orthogonal to the thickness direction of the substrate. In the former case, the recess may be recessed in the thickness direction of the substrate from the outermost surface of the substrate, or may be recessed in the thickness direction of the substrate from a flat surface other than it.

The first etching liquid is alkaline etching liquid in which the inert gas is forced to dissolve, and the second etching liquid is alkaline etching liquid in which the dissolution gas is forced to dissolve. As long as the dissolved oxygen concentration of the second etching liquid is higher than the dissolved oxygen concentration of the first etching liquid, the dissolution gas may be inert gas such as nitrogen gas or argon gas, or oxygen-containing gas containing oxygen.

In the preferred embodiment, at least one of the following features may be added to the substrate processing method.

The second etching step is a step of supplying the substrate with the second etching liquid after the first etching liquid is supplied to the substrate.

In this method, the first etching liquid having low dissolved oxygen concentration is supplied to the substrate, and then the second etching liquid having relatively high dissolved oxygen concentration is supplied to the substrate. When the second etching liquid is first supplied to the substrate, the etching target exposed on the side surface of the recess is oxidized. Thus, when the first etching liquid is supplied, the etching target is non-uniformly etched, or the etching speed is lowered. It is possible to shorten the processing time and bring the actual shape of the etching target that has been etched closer to the intended shape by supplying the first etching liquid first compared to the case where the second etching liquid is first supplied.

The second etching step includes a step of replacing the first etching liquid that is in contact with the substrate with the second etching liquid by supplying the second etching liquid to the substrate.

In this method, after the first etching liquid has been supplied to the substrate, the second etching liquid is supplied to the substrate rather than supplying liquid other than the second etching liquid to the substrate. Thus, the first etching liquid that is in contact with the substrate is replaced with the second etching liquid. If liquid other than the second etching liquid is supplied to the substrate before the second etching liquid is supplied, the etching target exposed on the side surface of the recess may be oxidized in an unintended manner. If the first etching liquid that is in contact with the substrate is replaced with the second etching liquid, it is possible to inhibit or prevent such oxidation and to etch the etching target with high precision.

The width of the concave portion before the first etching liquid and the second etching liquid are supplied decreases as a bottom of the concave portion is approached, and the second etching step is a step of etching the side surface of the concave portion such that an etching amount of the side surface of the concave portion increases as the bottom of the concave portion is approached.

In this method, the recess, which becomes narrower toward the bottom of the recess, is etched with the first etching liquid and the second etching liquid. When the first etching liquid is supplied, the etching target exposed on the side surface of the recess is uniformly etched, and when the second etching liquid is supplied, the etching amount of the etching target increases as the bottom of the recess is approached. After the first etching liquid and the second etching liquid are supplied, the width of the recess becomes uniform from the entrance of the recess to the bottom of the recess, or the non-uniformity of the width of the recess is reduced. Thus, in a case where the width of the recess before being etched is non-uniform, it is possible to arrange the shape of the recess.

At least one of the first etching liquid and the second etching liquid is alkaline etching liquid containing a chemical compound that inhibits contact of a hydroxide ion and the etching target.

Polysilicon is composed of many silicon single crystals. When polysilicon is etched with alkaline etching liquid not containing the chemical compound, very fine irregularities are formed on the surface of polysilicon. This is because the (110) plane, the (100) plane and the (111) plane of silicon are exposed on the surface of the polysilicon, and the etching speeds of the (110) plane, the (100) plane and the (111) plane of silicon differ from each other. For the same reason, when a silicon single crystal is etched, very fine irregularities are formed on the surface of the silicon single crystal.

A hydroxide ion ($OH^-$) in the alkaline etching liquid reacts with silicon (Si) and etches the etching target such as polysilicon. When the chemical compound is added to the alkaline etching liquid, contact between the hydroxide ion and silicon is inhibited and the etching speeds of the (110)

plane, the (100) plane and the (111) plane of silicon are lowered. However, the etching speeds do not decrease uniformly at the plurality of crystal planes but decrease relatively greatly at the crystal plane among these at which the etching speed is high. Thus, the difference in etching speed among the plurality of crystal planes is lowered.

As described above, anisotropy of the etching liquid with respect to the etching target such as polysilicon is lowered by adding the chemical compound to the alkaline etching liquid. That is, etching of the etching target is approached to isotropic etching and the etching target is etched with a uniform etching amount at every position. Thus, the dependence of the etching speed on the plane direction is mitigated. Accordingly, it is possible to suppress or prevent the generation of irregularities as described above and to flatten the surface of the etching target that has been etched.

Concentration of the chemical compound in the alkaline etching liquid is set according to required uniformity of the etching and required speed of the etching.

The first etching step includes a first etching liquid making step of making the first etching liquid by diluting alkaline undiluted liquid of the etching liquid with at least one of first diluting liquid and second diluting liquid having different dissolved oxygen concentrations, and the second etching step includes a second etching liquid making step of making the second etching liquid by diluting the undiluted liquid with at least one of the first diluting liquid and the second diluting liquid.

According to this method, the first etching liquid and the second etching liquid can be made by diluting the alkaline undiluted liquid of the etching liquid with at least one of the first diluting liquid and the second diluting liquid. the first diluting liquid and the second diluting liquid are liquids having different dissolved oxygen concentrations. Thus, it is possible to adjust dissolved oxygen concentrations of the first etching liquid and the second etching liquid by making ratios of the first diluting liquid and the second diluting liquid contained in the first etching liquid different from ratios of the first diluting liquid and the second diluting liquid contained in the second etching liquid.

The substrate processing method processes a plurality of substrates one by one.

The substrate processing method processes a plurality of substrates in a batch.

Another preferred embodiment of the present invention provides a substrate processing apparatus to process a substrate on which a concave portion is formed, the concave portion having a width shorter than a depth of the concave portion, the concave portion including an etching target that represents at least one of silicon single crystal, polysilicon and amorphous silicon and that is exposed on at least a portion of an upper portion of a side surface of the concave portion and at least a portion of a lower portion of the side surface, the substrate processing apparatus including a first etching unit that etches the etching target exposed on the side surface of the concave portion by supplying the substrate with alkaline first etching liquid in which inert gas is dissolved, and a second etching unit that etches the etching target exposed on the side surface of the concave portion by supplying the substrate with alkaline second etching liquid in which dissolution gas is dissolved and having dissolved oxygen concentration higher than that of the first etching liquid. According to this arrangement, the same effects as those of the substrate processing method described above can be obtained.

The above and other objects, features, and advantages of the present invention will become more apparent from the following detailed description of the preferred embodiments with reference to the attached drawings.

BRIEF DESCRIPTION OF THE DRAWINGS

FIG. 8 is a process chart for describing an example of the processing of the substrate which is executed by the substrate processing apparatus.

FIG. 10C is a schematic view showing another example of a cross-section of the substrate.

DETAILED DESCRIPTION OF PREFERRED EMBODIMENTS

Figure 1A:
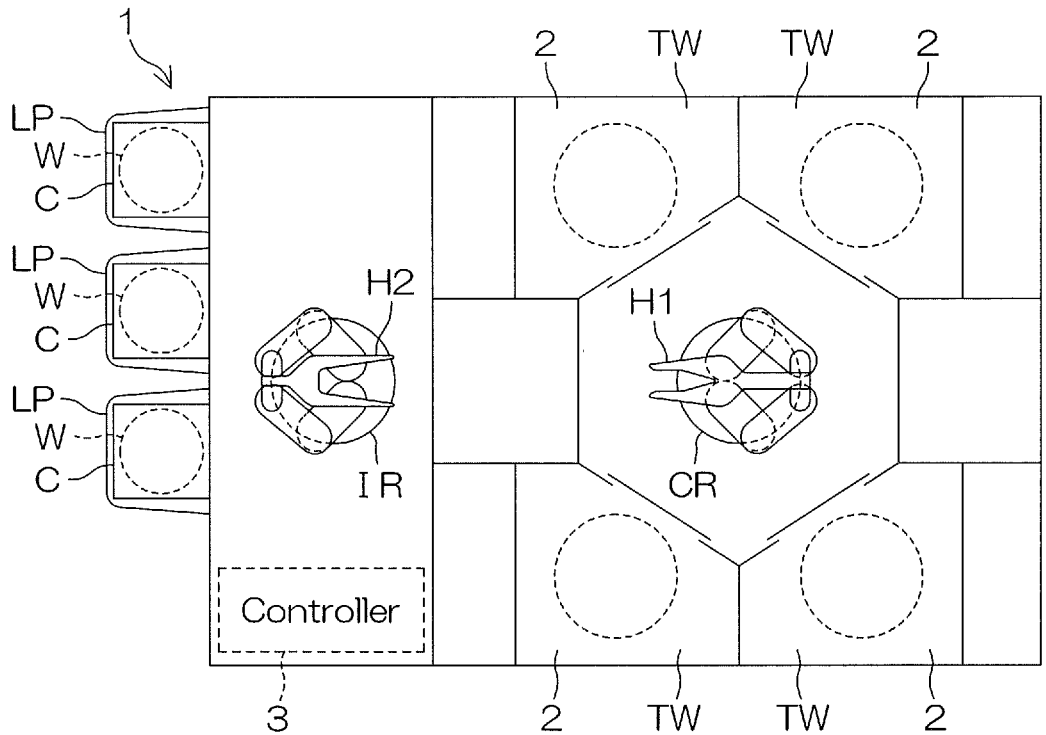
FIG. 1A is a schematic view of a substrate processing apparatus according to a first preferred embodiment of the present invention when viewed from above.
Figure 1B:
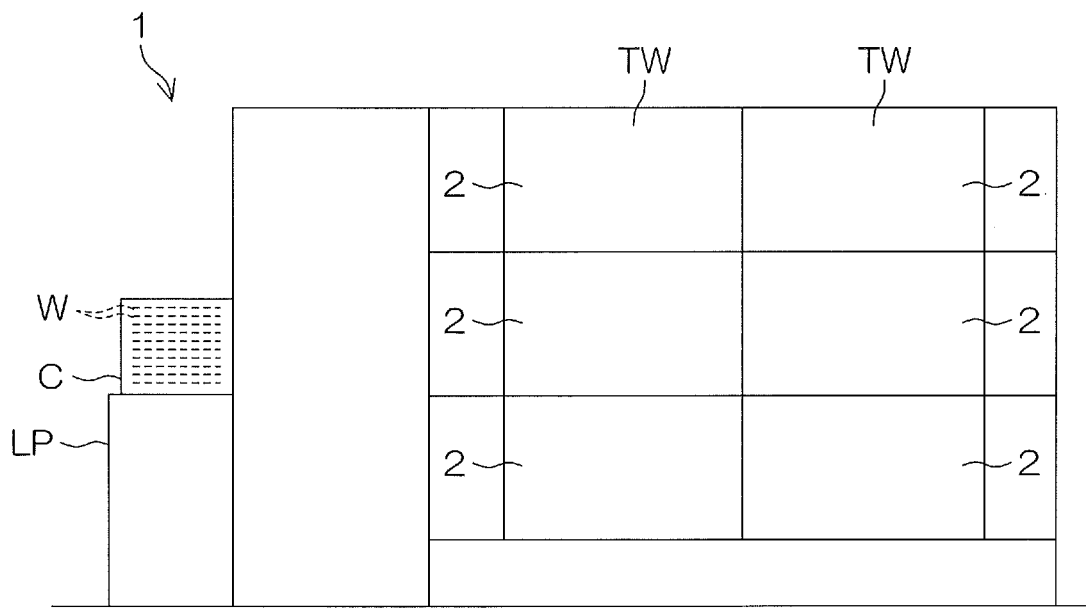
FIG. 1B is a schematic view of the substrate processing apparatus when viewed from the side.

FIG. 1A is a schematic view of a substrate processing apparatus 1 according to a first preferred embodiment of the present invention when viewed from above. FIG. 1B is a schematic view of the substrate processing apparatus 1 when viewed from a side.

The substrate processing apparatus 1 is a single substrate processing-type apparatus which processes disc-shaped substrates W such as semiconductor wafers one by one. The substrate processing apparatus 1 includes a load port LP which holds a carrier C that houses the substrates W, a plurality of processing units 2 which process the substrates W transferred from the carrier C on the load port LP, a transfer robot which transfers the substrates W between the carrier C on the load port LP and the processing unit 2 and a controller 3 which controls the substrate processing apparatus 1.

The transfer robot includes an indexer robot IR which carries the substrate W into and out from the carrier C on the load port LP and a center robot CR which carries the substrate W into and out from the processing units 2. The indexer robot IR transfers the substrate W between the load port LP and the center robot CR, the center robot CR transfers the substrate W between the indexer robot IR and the processing unit 2. The center robot CR includes a hand H1 which supports the substrate W and the indexer robot IR includes a hand H2 which supports the substrate W.

The plurality of processing units 2 form a plurality of towers TW disposed around the center robot CR in a plan view. FIG. 1A shows an example in which four towers TW are formed. The center robot CR is able to access any one of the towers TW. As shown in FIG. 1B, each tower TW includes a plurality of processing units 2 (for example, three processing units 2) stacked vertically.

Figure 2:
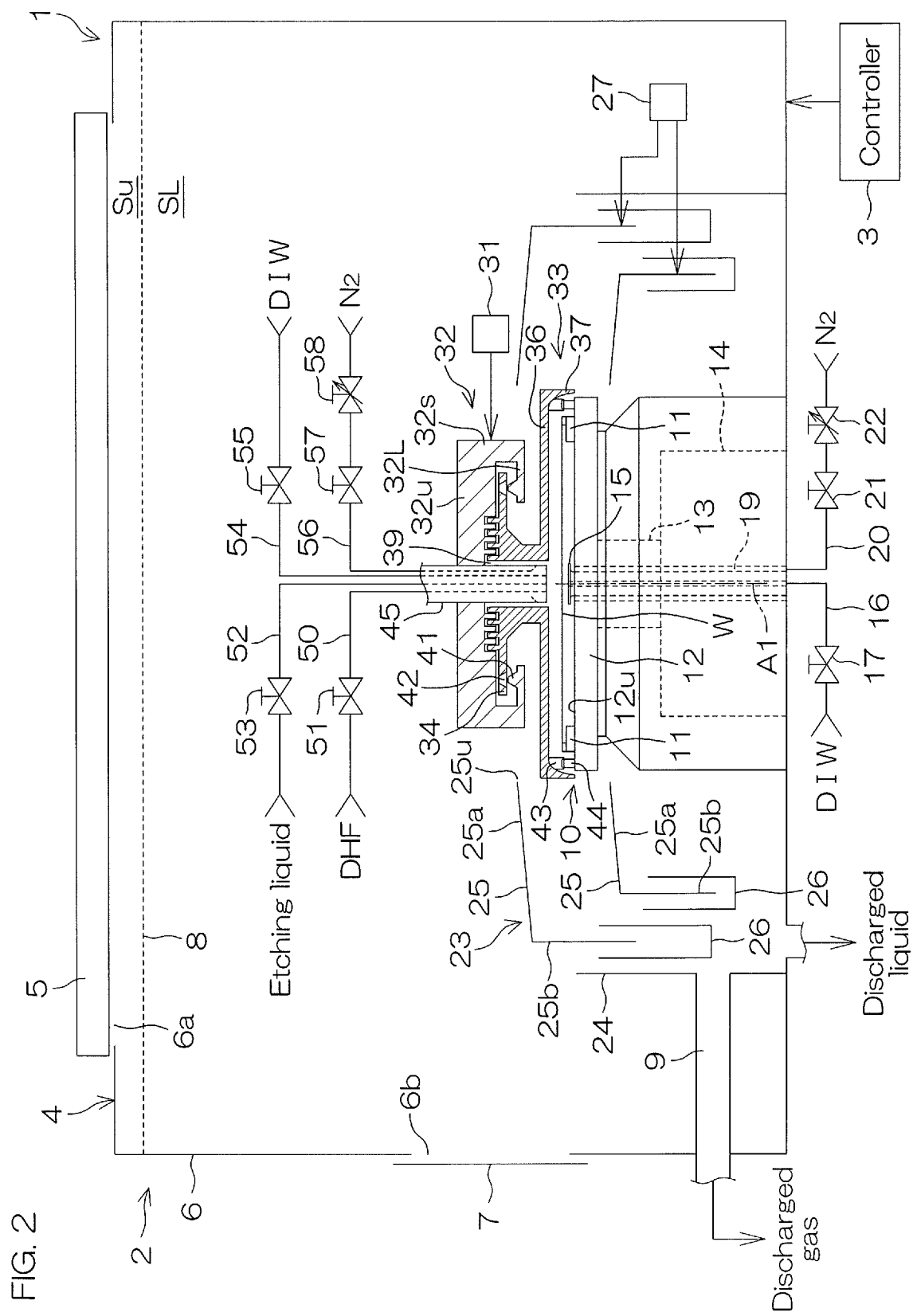
FIG. 2 is a schematic view of an interior of a processing unit included in the substrate processing apparatus when viewed horizontally.
Figure 3:
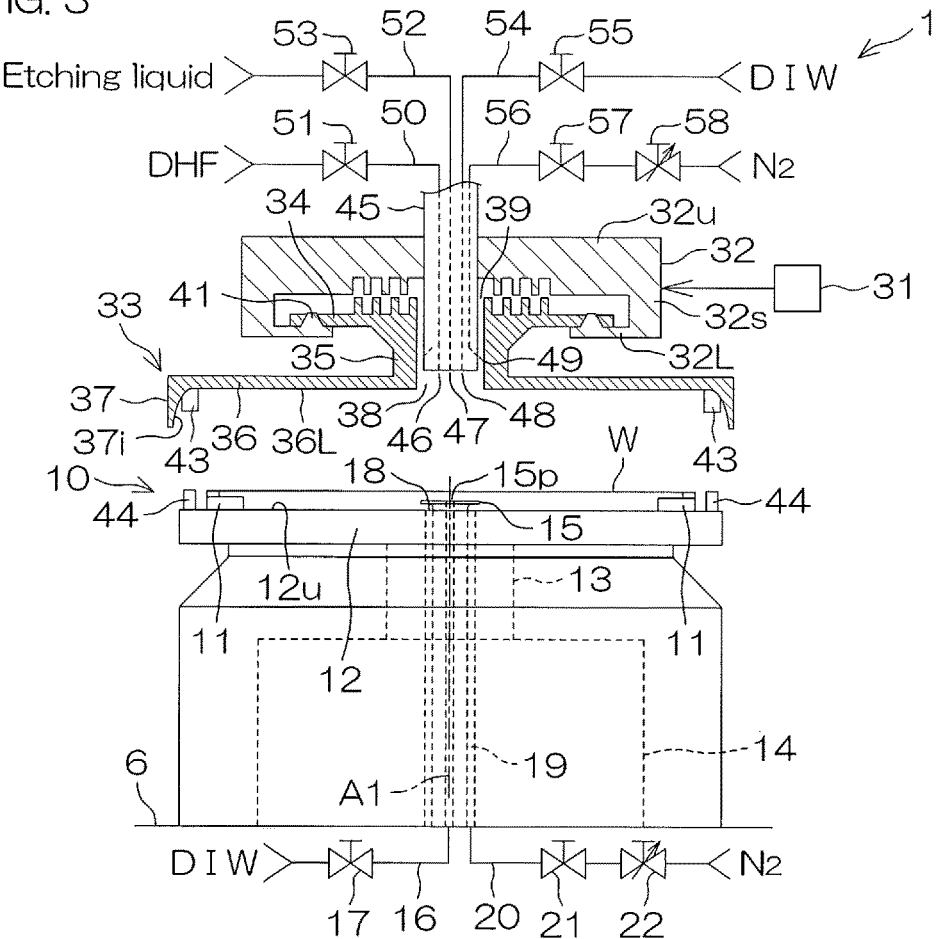
FIG. 3 is an enlarged view of a portion of FIG. 2.

FIG. 2 is a schematic view of the interior of a processing unit 2 included in the substrate processing apparatus 1 when viewed horizontally. FIG. 3 is an enlarged view of a portion of FIG. 2. FIG. 2 shows a state where a raising/lowering frame 32 and a shielding member 33 are located at lower positions and FIG. 3 shows a state where the raising/lowering frame 32 and the shielding member 33 are located at upper positions. In the following description, unless otherwise specified, TMAH represents aqueous solution of TMAH.

The processing unit 2 includes a box-shaped chamber 4 which has an internal space, a spin chuck 10 which rotates one substrate W around a vertical rotation axis A1 passing through the central portion of the substrate W while holding the substrate W horizontally within the chamber 4 and a tubular processing cup 23 which surrounds the spin chuck 10 around the rotation axis A1.

The chamber 4 includes a box-shaped partition wall 6 provided with a carry-in/carry-out port 6*b* through which the substrate W passes, and a shutter 7 which opens and closes the carry-in/carry-out port 6*b*. The chamber 4 further includes a rectifying plate 8 which is arranged below an air outlet 6*a* that is open in the ceiling surface of the partition wall 6. An FFU 5 (fan filter unit) which feeds clean air (air filtered by a filter) is arranged above the air outlet 6*a*. An exhaust duct 9 which discharges a gas within the chamber 4 is connected to the processing cup 23. The air outlet 6*a* is provided in an upper end portion of the chamber 4, and the exhaust duct 9 is arranged in a lower end portion of the chamber 4. A portion of the exhaust duct 9 is arranged outside the chamber 4.

The rectifying plate 8 partitions the internal space of the partition wall 6 into an upper space Su above the rectifying plate 8 and a lower space SL below the rectifying plate 8. The upper space Su between the ceiling surface of the partition wall 6 and the upper surface of the rectifying plate 8 is a diffusion space in which the clean air diffuses. The lower space SL between the lower surface of the rectifying plate 8 and the floor surface of the partition wall 6 is a processing space in which the substrate W is processed. The spin chuck 10 and the processing cup 23 are arranged in the lower space SL. A distance in a vertical direction from the floor surface of the partition wall 6 to the lower surface of the rectifying plate 8 is longer than a distance in the vertical direction from the upper surface of the rectifying plate 8 to the ceiling surface of the partition wall 6.

The FFU 5 feeds the clean air via the air outlet 6*a* to the upper space Su. The clean air supplied to the upper space Su hits the rectifying plate 8 and diffuses in the upper space Su. The clean air within the upper space Su passes through a plurality of through holes which vertically penetrate the rectifying plate 8 and flows downward from the entire region of the rectifying plate 8. The clean air supplied to the lower space SL is sucked into the processing cup 23 and is discharged through the exhaust duct 9 from the lower end portion of the chamber 4. Thus, a uniform downward flow (down flow) of the clean air which flows downward from the rectifying plate 8 is formed in the lower space SL. The processing of the substrate W is performed in a state where the downward flow of the clean air is formed.

The spin chuck 10 includes a disc-shaped spin base 12 which is held by a horizontal posture, a plurality of chuck pins 11 which hold the substrate W in the horizontal posture above the spin base 12, a spin shaft 13 which extends downward from the central portion of the spin base 12 and a spin motor 14 which rotates the spin shaft 13 so as to rotate the spin base 12 and the chuck pins 11. The spin chuck 10 is not limited to a clamping type chuck which brings the chuck pins 11 into contact with the outer circumferential surface of the substrate W, and the spin chuck 10 may be a vacuum-type chuck which sucks the rear surface (lower surface) of the substrate W that is a non-device formation surface to the upper surface 12*u* of the spin base 12 so as to hold the substrate W horizontally.

The spin base 12 includes the upper surface 12*u* which is arranged below the substrate W. The upper surface 12*u* of the spin base 12 is parallel to the lower surface of the substrate W. The upper surface 12*u* of the spin base 12 is an opposed surface which faces the lower surface of the substrate W. The upper surface 12*u* of the spin base 12 has a circular ring-shaped configuration which surrounds the rotation axis A1. The outside diameter of the upper surface 12*u* of the spin base 12 is larger than that of the substrate W. The chuck pins 11 protrude upward from the outer circumferential portion of the upper surface 12*u* of the spin base 12. The chuck pins 11 are held on the spin base 12. The substrate W is held on the chuck pins 11 in a state where the lower surface of the substrate W is separated from the upper surface 12*u* of the spin base 12.

The processing unit 2 includes a lower surface nozzle 15 which discharges the processing liquid toward the central portion of the lower surface of the substrate W. The lower surface nozzle 15 includes a nozzle disc portion which is arranged between the upper surface 12*u* of the spin base 12 and the lower surface of the substrate W and a nozzle tubular portion which extends downward from the nozzle disc portion. The liquid discharge port 15*p* of the lower surface nozzle 15 is open in the central portion of the upper surface of the nozzle disc portion. In a state where the substrate W is held on the spin chuck 10, the liquid discharge port 15*p* of the lower surface nozzle 15 faces the central portion of the lower surface of the substrate W.

The substrate processing apparatus 1 includes lower rinse liquid piping 16 which guide a rinse liquid to the lower surface nozzle 15 and a lower rinse liquid valve 17 which is interposed in the lower rinse liquid piping 16. When the lower rinse liquid valve 17 is opened, the rinse liquid guided by the lower rinse liquid piping 16 is discharged upward from the lower surface nozzle 15 and supplied to the central portion of the lower surface of the substrate W. The rinse liquid supplied to the lower surface nozzle 15 is pure water (DIW: deionized water). The rinse liquid supplied to the lower surface nozzle 15 is not limited to pure water, and may be any one of IPA (isopropyl alcohol), carbonated water, electrolytic ion water, hydrogen water, ozone water and a hydrochloric acid water of a dilute concentration (for example, about 1 to 100 ppm).

Although not shown, the lower rinse liquid valve 17 includes a valve body provided with an internal flow path where the liquid flows and an annular valve seat surrounding the internal flow path, a valve member which is movable with respect to the valve seat and an actuator which moves the valve member between a closed position where the valve member contacts the valve seat and an opened position where the valve member is separated from the valve seat. The same applies to other valves. The actuator may be a pneumatic actuator or an electric actuator or an actuator other than those. The controller 3 controls the actuator to open and close the lower rinse liquid valve 17.

The outer circumferential surface of the lower surface nozzle 15 and the inner circumferential surface of the spin base 12 defines a lower tubular path 19 which extends vertically. The lower tubular path 19 includes a lower central opening 18 which is open in the central portion of the upper surface 12u of the spin base 12. The lower central opening 18 is arranged below the nozzle disc portion of the lower surface nozzle 15. The substrate processing apparatus 1 includes lower gas piping 20 which guide an inert gas supplied via the lower tubular path 19 to the lower central opening 18, a lower gas valve 21 which is interposed in the lower gas piping 20 and a lower gas flow rate adjusting valve 22 which changes the flow rate of the inert gas supplied from the lower gas piping 20 to the lower tubular path 19.

The inert gas supplied from the lower gas piping 20 to the lower tubular path 19 is nitrogen gas. The inert gas is not limited to nitrogen gas, and may be another inert gas such as helium gas or argon gas. These inert gases are low oxygen gases which have an oxygen concentration lower than an oxygen concentration in air (about 21% of the volume).

When the lower gas valve 21 is opened, the nitrogen gas supplied from the lower gas piping 20 to the lower tubular path 19 is discharged upward from the lower central opening 18 at a flow rate corresponding to the degree of opening of the lower gas flow rate adjusting valve 22. Thereafter, the nitrogen gas flows radially in all directions in a space between the lower surface of the substrate W and the upper surface 12u of the spin base 12. Thus, the space between the substrate W and the spin base 12 is filled with the nitrogen gas, and thus an oxygen concentration in an atmosphere is reduced. The oxygen concentration in the space between the substrate W and the spin base 12 is changed according to the degree of opening of the lower gas valve 21 and the lower gas flow rate adjusting valve 22. The lower gas valve 21 and the lower gas flow rate adjusting valve 22 are included in an atmosphere oxygen concentration changing unit that changes oxygen concentration in an atmosphere that is in contact with the substrate W.

The processing cup 23 includes a plurality of guards 25 which receive the liquid discharged outward from the substrate W, a plurality of cups 26 which receive the liquid guided downward by the guards 25 and a cylindrical outer wall member 24 which surrounds the guards 25 and the cups 26. FIG. 2 shows an example where two guards 25 and two cups 26 are provided.

The guard 25 includes a cylindrical guard tubular portion 25b which surrounds the spin chuck 10 and an annular guard ceiling portion 25a which extends obliquely upward from the upper end portion of the guard tubular portion 25b toward the rotation axis A1. Guard ceiling portions 25a vertically overlap each other, and guard tubular portions 25b are arranged concentrically. The cups 26 are arranged below the guard tubular portions 25b, respectively. The cup 26 defines an annular liquid receiving groove which is open upward.

The processing unit 2 includes a guard raising/lowering unit 27 which individually raises and lowers the guards 25. The guard raising/lowering unit 27 locates the guard 25 in an arbitrary position from an upper position to a lower position. The upper position is the position in which the upper end 25u of the guard 25 is arranged higher than a holding position in which the substrate W held by the spin chuck 10 is arranged. The lower position is the position in which the upper end 25u of the guard 25 is arranged lower than the holding position. The annular upper end of the guard ceiling portion 25a corresponds to the upper end 25u of the guard 25. The upper end 25u of the guard 25 surrounds the substrate W and the spin base 12 in plan view.

When the processing liquid is supplied to the substrate W in a state where the spin chuck 10 rotates the substrate W, the processing liquid supplied to the substrate W is spun off from the substrate W. When the processing liquid is supplied to the substrate W, at least one of the upper ends 25u of the guards 25 is arranged higher than the substrate W. Thus, the processing liquid such as the chemical liquid or the rinse liquid which is discharged from the substrate W is received by any one of the guards 25 and guided to the cup 26 corresponding to this guard 25.

As shown in FIG. 3, the processing unit 2 includes the raising/lowering frame 32 which is arranged above the spin chuck 10, the shielding member 33 which is suspended from the raising/lowering frame 32, a center nozzle 45 which is inserted into the shielding member 33 and a shielding member raising/lowering unit 31 which raises and lowers the raising/lowering frame 32 so as to raise and lower the shielding member 33 and the center nozzle 45. The raising/lowering frame 32, the shielding member 33 and the center nozzle 45 are arranged below the rectifying plate 8.

The shielding member 33 includes a disc portion 36 which is arranged above the spin chuck 10 and a tubular portion 37 which extends downward from the outer circumferential portion of the disc portion 36. The shielding member 33 includes an inner surface which has a cup-shaped configuration that is concave upward. The inner surface of the shielding member 33 includes a lower surface 36L of the disc portion 36 and the inner circumferential surface 37i of the tubular portion 37. In the following description, the lower surface 36L of the disc portion 36 may also be referred to as the lower surface 36L of the shielding member 33.

The lower surface 36L of the disc portion 36 is an opposed surface which faces the upper surface of the substrate W. The lower surface 36L of the disc portion 36 is parallel to the upper surface of the substrate W. The inner circumferential surface 37i of the tubular portion 37 extends downward from the outer circumferential edge of the lower surface 36L of the lower surface 36L. The inside diameter of the tubular portion 37 is increased as the lower end of the inner circumferential surface 37i is approached. The inside diameter of the lower end of the inner circumferential surface 37i of the tubular portion 37 is larger than the diameter of the substrate W. The inside diameter of the lower end of the inner circumferential surface 37i of the tubular portion 37 may be larger than the outside diameter of the spin base 12. When the shielding member 33 is arranged in the lower position (position shown in FIG. 2) which will be described below, the substrate W is surrounded by the inner circumferential surface 37i of the tubular portion 37.

The lower surface 36L of the disc portion 36 has a circular ring-shaped configuration which surrounds the rotation axis A1. The inner circumferential edge of the lower surface 36L of the disc portion 36 defines an upper central opening 38 which is open in the central portion of the lower surface 36L of the disc portion 36. The inner circumferential surface of the shielding member 33 defines a through hole which extends upward from the upper central opening 38. The through hole of the shielding member 33 vertically penetrates the shielding member 33. The center nozzle 45 is inserted into the through hole of the shielding member 33. The outside diameter of the lower end of the center nozzle 45 is smaller than the diameter of the upper central opening 38.

The inner circumferential surface of the shielding member 33 is coaxial with the outer circumferential surface of the center nozzle 45. The inner circumferential surface of the shielding member 33 surrounds the outer circumferential surface of the center nozzle 45 across an interval in a radial direction (direction orthogonal to the rotation axis A1). The inner circumferential surface of the shielding member 33 and the outer circumferential surface of the center nozzle 45 define an upper tubular path 39 which extends vertically. The center nozzle 45 protrudes upward from the raising/lowering frame 32 and the shielding member 33. When the shielding member 33 is suspended from the raising/lowering frame 32, the lower end of the center nozzle 45 is arranged higher than the lower surface 36L of the disc portion 36. The processing liquid such as the chemical liquid or the rinse liquid is discharged downward from the lower end of the center nozzle 45.

The shielding member 33 includes a tubular connection portion 35 which extends upward from the disc portion 36, and an annular flange portion 34 which extends outward from the upper end portion of the connection portion 35. The flange portion 34 is arranged higher than the disc portion 36 and the tubular portion 37 of the shielding member 33. The flange portion 34 is parallel to the disc portion 36. The outside diameter of the flange portion 34 is smaller than that of the tubular portion 37. The flange portion 34 is supported on the lower plate 32L of the raising/lowering frame 32 which will be described below.

The raising/lowering frame 32 includes an upper plate 32u which is positioned higher than the flange portion 34 of the shielding member 33, a side ring 32s which extends downward from the upper plate 32u and surrounds the flange portion 34, and an annular lower plate 32L which extends inward from the lower end portion of the side ring 32s and is located below the flange portion 34 of the shielding member 33. The outer circumferential portion of the flange portion 34 is arranged between the upper plate 32u and the lower plate 32L. The outer circumferential portion of the flange portion 34 is movable vertically in a space between the upper plate 32u and the lower plate 32L.

The raising/lowering frame 32 and the shielding member 33 include locating protrusions 41 and locating holes 42 which restrict the relative movement of the raising/lowering frame 32 and the shielding member 33 in a circumferential direction (a direction around the rotation axis A1) in a state where the shielding member 33 is supported by the raising/lowering frame 32. FIG. 2 shows an example where a plurality of locating protrusions 41 are provided on the lower plate 32L and where a plurality of locating holes 42 are provided in the flange portion 34. The locating protrusions 41 may be provided on the flange portion 34, and the locating holes 42 may be provided in the lower plate 32L.

The locating protrusions 41 are arranged on a circle which has a center arranged on the rotation axis A1. Similarly, the locating holes 42 are arranged on a circle which has a center arranged on the rotation axis A1. The locating holes 42 are arranged in the circumferential direction with the same regularity as the locating protrusions 41. The locating protrusions 41 which protrude upward from the upper surface of the lower plate 32L are inserted into the locating holes 42 which extend upward from the lower surface of the flange portion 34. Thus, the movement of the shielding member 33 in the circumferential direction with respect to the raising/lowering frame 32 is restricted.

The shielding member 33 includes a plurality of upper support portions 43 which protrude downward from the inner surface of the shielding member 33. The spin chuck 10 includes a plurality of lower support portions 44 which supports the upper support portions 43, respectively. The upper support portions 43 are surrounded by the tubular portion 37 of the shielding member 33. The lower ends of the upper support portions 43 are arranged higher than the lower end of the tubular portion 37. The distance in the radial direction from the rotation axis A1 to the upper support portion 43 is larger than the radius of the substrate W. Similarly, the distance in the radial direction from the rotation axis A1 to the lower support portion 44 is larger than the radius of the substrate W. The lower support portions 44 protrude upward from the upper surface 12u of the spin base 12. The lower support portions 44 are arranged on the outer side with respect to the chuck pins 11.

The upper support portions 43 are arranged on a circle which has a center arranged on the rotation axis A1. Similarly, the lower support portions 44 are arranged on a circle which has a center arranged on the rotation axis A1. The lower support portions 44 are arranged in the circumferential direction with the same regularity as the upper support portions 43. The lower support portions 44 are rotated together with the spin base 12 around the rotation axis A1. The rotational angle of the spin base 12 is changed by the spin motor 14. When the spin base 12 is arranged at a reference rotational angle, the upper support portions 43 respectively overlap the lower support portions 44 in plan view.

The shielding member raising/lowering unit 31 is coupled to the raising/lowering frame 32. When the shielding member raising/lowering unit 31 lowers the raising/lowering frame 32 in a state where the flange portion 34 of the shielding member 33 is supported on the lower plate 32L of the raising/lowering frame 32, the shielding member 33 is also lowered. When the shielding member raising/lowering unit 31 lowers the shielding member 33 in a state where the spin base 12 is arranged at such a reference rotational angle that the upper support portions 43 respectively overlap the lower support portions 44 in plan view, the lower end portions of the upper support portions contact the upper end portions of the lower support portions 44. Thus, the upper support portions 43 are respectively supported on the lower support portions 44.

When the shielding member raising/lowering unit 31 lowers the raising/lowering frame 32 after the upper support portions 43 of the shielding member 33 contact the lower support portions 44 of the spin chuck 10, the lower plate 32L of the raising/lowering frame 32 is moved downward with respect to the flange portion 34 of the shielding member 33. Thus, the lower plate 32L is separated from the flange portion 34, and thus the locating protrusions 41 are removed from the locating holes 42. Furthermore, the raising/lowering frame 32 and the center nozzle 45 are moved downward with respect to the shielding member 33, and thus the difference in height between the lower end of the center nozzle 45 and the lower surface 36L of the disc portion 36 of the shielding member 33 is reduced. Here, the raising/lowering frame 32 is arranged at such a height (the lower position which will be described below) that the flange portion 34 of the shielding member 33 does not contact the upper plate 32u of the raising/lowering frame 32.

The shielding member raising/lowering unit 31 locates the raising/lowering frame 32 in an arbitrary position from the upper position (position shown in FIG. 3) to the lower position (position shown in FIG. 2). The upper position is the position in which the locating protrusions 41 are inserted into the locating holes 42 and in which the flange portion 34 of the shielding member 33 contact the lower plate 32L of the raising/lowering frame 32. In other words, the upper position is the position in which the shielding member 33 is suspended from the raising/lowering frame 32. The lower position is the position in which the lower plate 32L is separated from the flange portion 34 and in which the locating protrusions 41 are removed from the locating holes 42. In other words, the lower position is the position in which the coupling of the raising/lowering frame 32 and the shielding member 33 is released and in which the shielding member 33 does not contact any portion of the raising/lowering frame 32.

When the raising/lowering frame 32 and the shielding member 33 are moved to the lower position, the lower ends of the tubular portion 37 of the shielding member 33 are arranged lower than the lower surface of the substrate W, and thus the space between the upper surface of the substrate W and the lower surface 36L of the shielding member 33 is surrounded by the tubular portion 37 of the shielding member 33. Thus, the space between the upper surface of the substrate W and the lower surface 36L of the shielding member 33 is shielded not only from an atmosphere above the shielding member 33 but also from an atmosphere around the shielding member 33. Therefore, it is possible to enhance the sealing performance to seal the space between the upper surface of the substrate W and the lower surface 36L of the shielding member 33.

Furthermore, when the raising/lowering frame 32 and the shielding member 33 are arranged in the lower position, even if the shielding member 33 is rotated around the rotation axis A1, the shielding member 33 is prevented from colliding with the raising/lowering frame 32. When the upper support portions 43 of the shielding member 33 are supported on the lower support portions 44 of the spin chuck 10, the upper support portions 43 and the lower support portions 44 engage with each other, and thus the relative movement of the upper support portions 43 and the lower support portions 44 in the circumferential direction is prevented. When the spin motor 14 rotates in this state, the torque of the spin motor 14 is transmitted to the shielding member 33 via the upper support portions 43 and the lower support portions 44. Thus, the shielding member 33 rotates in the same direction and at the same speed as the spin base 12 in a state where the raising/lowering frame 32 and the center nozzle 45 are stationary.

The center nozzle 45 includes a plurality of liquid discharge ports through which the liquid is discharged and a gas discharge port through which the gas is discharged. The plurality of liquid discharge ports include a chemical liquid discharge port 46 through which a chemical liquid is discharged, an etching liquid discharge port 47 through which an etching liquid is discharged and an upper rinse liquid discharge port 48 through which the rinse liquid is discharged. The gas discharge port is an upper gas discharge port 49 through which an inert gas is discharged. The chemical liquid discharge port 46, the etching liquid discharge port 47, the upper rinse liquid discharge port 48 are open in the lower end of the center nozzle 45. The upper gas discharge port 49 is open in the outer circumferential surface of the center nozzle 45.

The chemical liquid is a liquid which contains at least one of sulfuric acid, nitric acid, hydrochloric acid, hydrofluoric acid, phosphoric acid, acetic acid, ammonia water, hydrogen peroxide water, organic acids (for example, citric acid, oxalic acid), organic alkalis (for example, TMAH: tetramethylammonium hydroxide), a surfactant, a polyhydric alcohol and a corrosion inhibitor, for example. Sulfuric acid, nitric acid, hydrochloric acid, hydrofluoric acid, phosphoric acid, acetic acid, ammonia water, hydrogen peroxide water, citric acid, oxalic acid and TMAH are also etching liquids.

FIG. 2, etc., show an example where the chemical liquid is DHF (dilute hydrofluoric acid). Also, FIG. 2, etc., show the example where the rinse liquid supplied to the center nozzle 45 is pure water and where the inert gas supplied to the center nozzle 45 is nitrogen gas. The rinse liquid supplied to the center nozzle 45 may be a rinse liquid other than pure water. The inert gas supplied to the center nozzle 45 may be an inert gas other than nitrogen gas.

The substrate processing apparatus 1 includes chemical liquid piping 50 which guide the chemical liquid to the center nozzle 45, a chemical liquid valve 51 which is interposed in the chemical liquid piping 50, etching liquid piping 52 which guide the etching liquid to the center nozzle 45, an etching liquid valve 53 which is interposed in the etching liquid piping 52, upper rinse liquid piping 54 which guide the rinse liquid to the center nozzle 45 and an upper rinse liquid valve 55 which is interposed in the upper rinse liquid piping 54. The substrate processing apparatus 1 further includes upper gas piping 56 which guide the gas to the center nozzle 45, an upper gas valve 57 which is interposed in the upper gas piping 56 and an upper gas flow rate adjusting valve 58 which changes the flow rate of the gas supplied from the upper gas piping 56 to the center nozzle 45.

When the chemical liquid valve 51 is opened, the chemical liquid is supplied to the center nozzle 45 and is discharged downward from the chemical liquid discharge port 46 which is open in the lower end of the center nozzle 45. When the etching liquid valve 53 is opened, the etching liquid is supplied to the center nozzle 45 and is discharged downward from the etching liquid discharge port 47 which is open in the lower end of the center nozzle 45. When the upper rinse liquid valve 55 is opened, the rinse liquid is supplied to the center nozzle 45 and is discharged downward from the upper rinse liquid discharge port 48 which is open in the lower end of the center nozzle 45. Thus, the processing liquid such as the chemical liquid is supplied to the upper surface of the substrate W.

When the upper gas valve 57 is opened, the nitrogen gas guided by the upper gas piping 56 is supplied to the center nozzle 45 at a flow rate corresponding to the degree of opening of the upper gas flow rate adjusting valve 58 and is discharged obliquely downward from the upper gas discharge port 49 which is open in the outer circumferential surface of the center nozzle 45. Thereafter, the nitrogen gas flows downward within the upper tubular path 39 while flowing in the circumferential direction within the upper tubular path 39. The nitrogen gas that has reached the lower end of the upper tubular path 39 flows downward from the lower end of the upper tubular path 39. Thereafter, the nitrogen gas flows radially in all directions in the space between the upper surface of the substrate W and the lower surface 36L of the shielding member 33. Thus, the space between the substrate W and the shielding member 33 is filled with the nitrogen gas, and the oxygen concentration in the atmosphere is reduced. The oxygen concentration in the space between the substrate W and the shielding member 33 is changed according to the degree of opening of the upper gas valve 57 and the upper gas flow rate adjusting valve 58. The upper gas valve 57 and the upper gas flow rate adjusting valve 58 are included in the atmosphere oxygen concentration changing unit.

Figure 4:
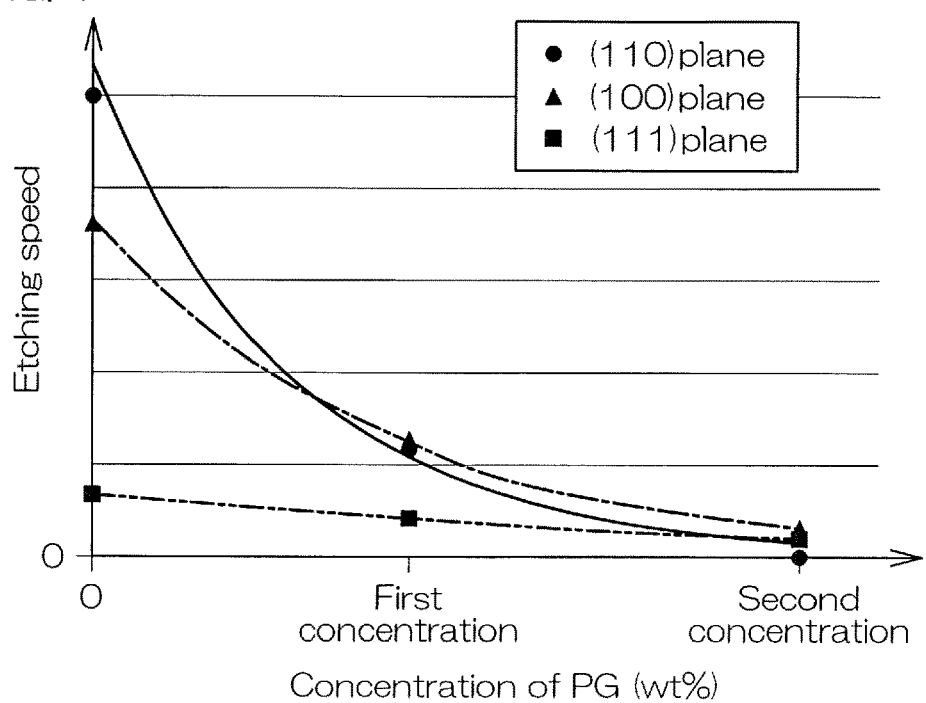
FIG. 4 is a graph showing an example of a relationship between the etching speeds of three crystal planes of silicon and the concentration of propylene glycol in the etching liquid.
Figure 5A:
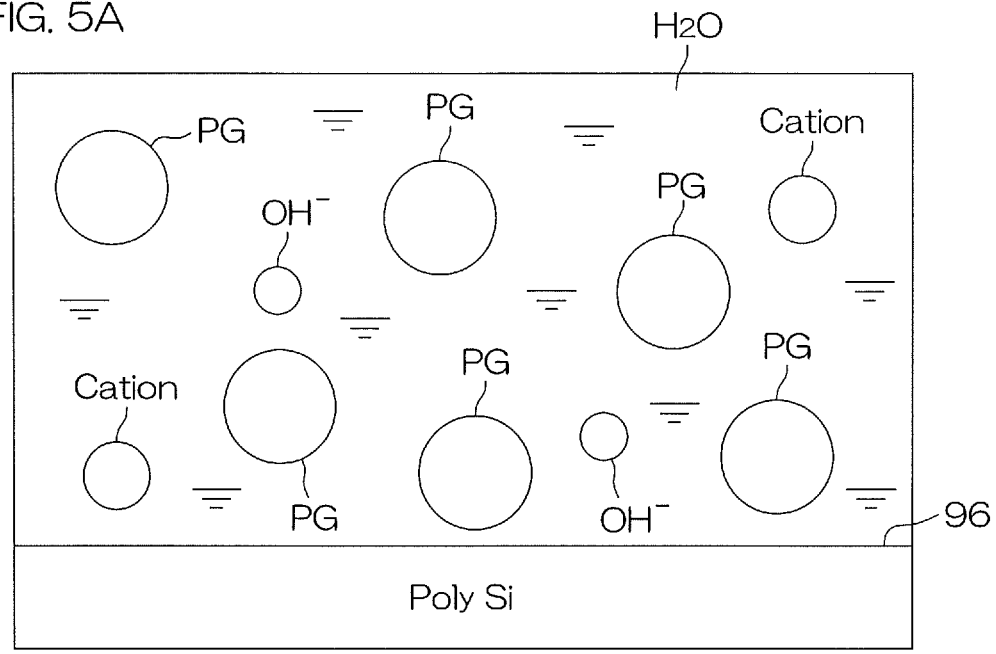
FIG. 5A is a view for describing an assumed mechanism in which the contact between hydroxide ions and polysilicon is inhibited by the chemical compound.
Figure 5B:
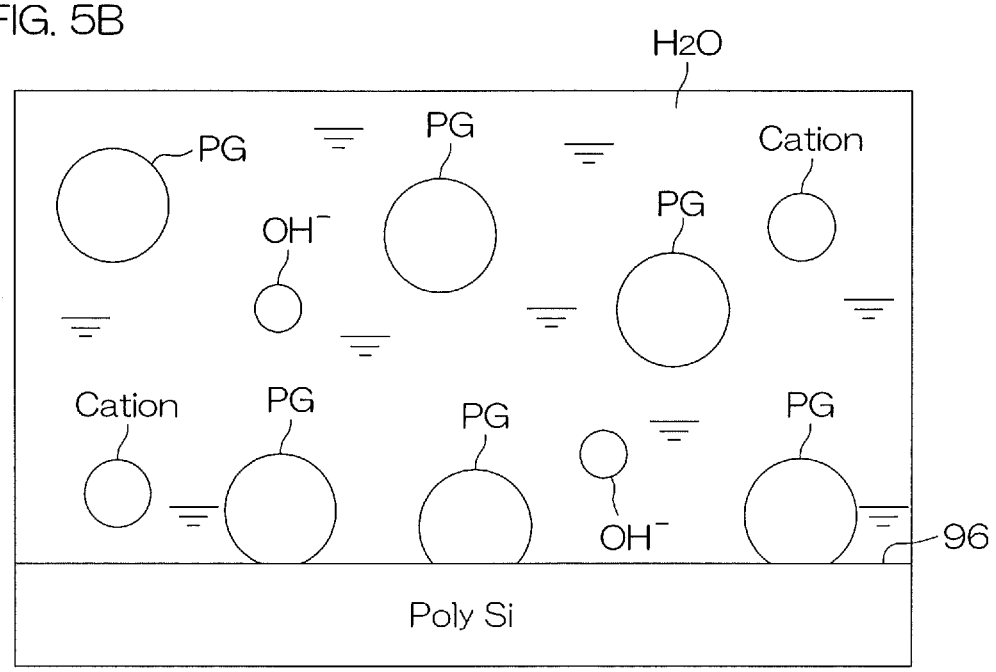
FIG. 5B is a view for describing an assumed mechanism in which the contact between hydroxide ions and polysilicon is inhibited by the chemical compound.

FIG. 4 is a graph showing an example of a relationship between the etching speeds of three crystal planes of silicon and the concentration of propylene glycol in the etching liquid. FIG. 5A and FIG. 5B are views for describing an assumed mechanism in which the contact between hydroxide ions and polysilicon is inhibited by the chemical compound. "PG" in FIG. 4, FIG. 5A and FIG. 5B represents propylene glycol.

The substrate processing apparatus 1 supplies the substrate W with etching liquid, which dissolves a portion of the substrate W by corroding a portion of the substrate W, and a chemical compound, which lowers anisotropy of the etching liquid with respect to silicon single crystal, either separately or pre-mixed.

The etching liquid is alkaline liquid that etches an etching target 96 representing at least one of silicon single crystal, polysilicon and amorphous silicon (refer to FIG. 5A) and that does not or hardly etches a non-etching target such as silicon oxide or silicon nitride. The pH (hydrogen-ion exponent) of the etching liquid is 12 or higher, for example. If the processing conditions are the same, the etching amount of the etching target 96 per unit time is larger than the etching amount of the non-etching target per unit time.

The etching liquid is liquid that performs anisotropy etching with respect to a silicon single crystal (silicon single crystals in polysilicon are included). That is, if the processing conditions are the same, when the (110) plane, the (100) plane and the (111) plane of silicon are etched by the etching liquid, the etching speed of the (110) plane is the highest and the etching speed of the (111) plane is the lowest. Thus, the etching speed differs for each crystal plane of silicon.

The etching liquid may be solution in which hydroxides of alkali metal such as sodium or potassium are dissolved (NaOH solution or KOH solution), or may be solution such as TMAH in which quaternary ammonium hydroxides are dissolved. The quaternary ammonium hydroxide may be at least one of TMAH, TBAH (Tetrabutylammonium hydroxide), TPeAH (Tetrapentylammonium hydroxide), THAH (Tetrahexylammonium hydroxide), TEAH (Tetraethylammonium hydroxide), TPAH (Tetrapropylammonium hydroxide) and choline hydroxide, or may be other than these. These are all included in organic alkalis. Note that in this paragraph, TMAH refers to an anhydride, not an aqueous solution. The same applies to other quaternary ammonium hydroxides such as TBAH.

When a quaternary ammonium hydroxide dissolves in water, the quaternary ammonium hydroxide separates into a positive ion (a cation) and a hydroxide ion. Thus, there is the hydroxide ion in the solution of the quaternary ammonium hydroxide. Similarly, there is the hydroxide ion in the solution of the alkali metal hydroxide such as sodium or potassium. The chemical compound supplied to the substrate W is an inhibitor that inhibits contact between the hydroxide ion and the etching target 96. The molecule of the inhibitor is preferably larger than the hydroxide ion. The inhibitor is also preferably a water-soluble substance that dissolves in water. The inhibitor may be a surfactant including both of hydrophilic groups and hydrophobic groups. As long as it is uniformly dispersed in the etching liquid, the inhibitor may be an insoluble substance that does not dissolve in water.

The etching liquid is supplied to the substrate W with or without being mixed with the chemical compound. The chemical compound is a substance that dissolves in the etching liquid. the chemical compound may be glycol or ether, or may be a substance other than glycol and ether such as glycerin. the chemical compound may be a mixture of two or more substances of different types, or a mixture of two or more substances belonging to the same type. In the latter case, the chemical compound may be two or more substances belonging to any of glycol, ether and glycerin.

The glycol may be any of ethylene glycol, diethylene glycol and propylene glycol. The glycol is preferably propylene glycol. The glycol is an example of a substance that is not involved in the reaction between silicon (Si) and hydroxide ion ($OH^-$). That is, the glycol is an example of a substance that does not react with atoms etc., involved in the reaction between silicon and hydroxide ion. The glycol is an example of a substance that does not act as a catalyst in this reaction.

In a case where alkaline etching liquid containing the chemical compound (mixed liquid of the chemical compound, the hydroxide, and water) is supplied to the substrate W, the concentration of the hydroxide such as TMAH is 0.1 to 25 wt %, for example, and the concentration of the chemical compound is 0.001 to 40 wt %, for example. The concentration of the hydroxide is preferably 0.25 to 20 wt %. The concentration of the chemical compound is preferably 0.5 to 30%.

FIG. 5A and FIG. 5B show examples where the etching liquid containing propylene glycol which is an example of the chemical compound (the mixed liquid of the etching liquid and propylene glycol) is supplied to polysilicon which is an example of the etching target 96. "Cation" and "$OH^-$" in FIG. 5A and FIG. 5B are ones into which the hydroxide contained in the etching liquid (alkali metal hydroxides or quaternary ammonium hydroxide) separates.

The silicon contained in the etching target 96 such as polysilicon reacts with the hydroxide ion as represented by the formula "$Si + 4OH^- \rightarrow Si(OH)_4 + 4e^-$." Thus, the silicon contained in the etching target 96 dissolves in the etching liquid and etching of the etching target 96 progresses. The chemical compound contained in the etching liquid becomes a steric obstacle for the hydroxide ion. That is, the chemical compound drifting in the etching liquid or the chemical compound adsorbed or coordinated to the polysilicon blocks the movement of the hydroxide ion in the etching liquid toward the polysilicon. Thus, the number of the hydroxide ions that reach the polysilicon decreases and the etching speed of the polysilicon is lowered. It is thought that by such a mechanism the contact between the hydroxide ion and the polysilicon is inhibited by the chemical compound.

Although decrease in etching speed occurs on a plurality of crystal planes of silicon contained in polysilicon, the etching speed decreases relatively greatly in a crystal plane having a high etching speed among the plurality of crystal planes of silicon. Thus, the difference in etching speed between the plurality of crystal planes is reduced, and anisotropy of etching liquid with respect to silicon single crystal is lowered. That is, the polysilicon is uniformly etched regardless of plane directions of silicon exposed at the surface of the polysilicon. It is thought that by such a mechanism the polysilicon is etched with a uniform etching amount at every position.

FIG. 4 shows measured values of etching speeds of the (110) plane, the (100) plane, and the (111) plane when silicon single crystal is etched using three types of TMAH (concentration zero, the first concentration, the second concentration) which are different in concentration of propylene glycol. The etching conditions in which the measured values shown in FIG. 4 are obtained are identical except for the concentration of the propylene glycol in TMAH. For example, the temperature of TMAH is 40 degrees Celsius and the concentration of TMAH in which propylene glycol is not added is 5 wt % (mass percent concentration). The dissolved oxygen concentration of TMAH is lowered in advance.

As shown in FIG. 4, when the concentration of the propylene glycol is zero, the etching speed of the (110) plane is highest and the etching speed of the (111) plane is lowest. As can be seen from the three curves in FIG. 4, adding propylene glycol to TMAH reduces the etching speed. Further, the etching speed of any crystal plane decreases as the concentration of propylene glycol increases.

However, in the range of the concentration of the propylene glycol from zero to the first concentration, the etching speeds of the (110) plane and the (100) plane sharply decrease, while the etching speed of the (111) plane decreases very slowly. Thus, in this range, the difference between the maximum value of the etching speed and the minimum value of the etching speed decreases as the concentration of the propylene glycol increases.

When the concentration of the propylene glycol exceeds the first concentration, although a decrease ratio of the etching speed (a ratio of absolute value of change in etching speed to absolute value of change in concentration of propylene glycol) is lowered, the decrease ratios of the etching speeds of the (110) plane and the (100) plane are larger than the decrease ratio of the etching speed of the (111) plane until a value near the middle between the first concentration and the second concentration. Thus, the difference between the maximum value of the etching speed and the minimum value of the etching speed is also decreasing in the range of the concentration of the propylene glycol to the value near the middle between the first concentration and the second concentration.

In this way, when propylene glycol is added to TMAH that shows anisotropy with respect to silicon single crystal, plane direction selectivity, that is, the difference between the maximum value of the etching speed and the minimum value of the etching speed decreases and anisotropy of TMAH with respect to silicon single crystal is lowered. On the other side, in the range of the concentration of the propylene glycol to the value near the middle between the first concentration and the second concentration, the etching speeds of the (110) plane and the (100) plane decrease at a large decrease ratio as the concentration of the propylene glycol increases. Thus, the concentration of the propylene glycol may be set in accordance with the required uniformity of the etching and required etching speed.

For example, the inhibitor such as propylene glycol may be administered excessively to the etching liquid. According to the measured result shown in FIG. 4, the effect of the mitigation of anisotropy is relatively small when the propylene glycol is added at a small amount (for example, about 5 to 10 wt %), but the remarkable effect of the mitigation of anisotropy is recognized when the propylene glycol is added at a large amount (for example, 20 wt % or more), that is, the propylene glycol is administered excessively. On the other side, since the etching speed is lowered, the concentration of the propylene glycol may be selected in accordance with the required quality and the allowable processing time.

The tendency shown in FIG. 4 was also observed for combinations other than TMAH and propylene glycol. Thus, the etching liquid is not restricted to TMAH, and the chemical compound is not restricted to propylene glycol. It is assumed that the tendency shown in FIG. 4 is also observed not only when the etching liquid containing the chemical compound is supplied to the etching target 96, but also when the chemical compound and the etching liquid are separately supplied to the substrate W and mixed on the etching target 96. Thus, the chemical compound and the etching liquid may be separately supplied to the substrate W.

If the conditions other than the type of the chemical compound (if the chemical compound is a mixture of two or more substances, it also includes a combination of substances.) are the same, when the type of the chemical compound supplied to the etching target 96 is different, at least one of the etching speeds of the (110) plane, the (100) plane and the (111) plane of silicon is different. Thus, the type of the chemical compound may be selected in accordance with the required quality and the allowable processing time.

In a case in which the etching liquid is supplied to the etching target 96 without supplying the chemical compound to the etching target 96, when the temperature of the etching liquid is raised, the etching speeds of the (110) plane and the (100) plane increase at an amount of change larger than an amount of change of the etching speed of the (111) plane. Also, in this case, when the temperature of the etching liquid is lowered, the etching speeds of the (110) plane and the (100) plane are lowered at an amount of change larger than an amount of change of the etching speed of the (111) plane.

Thus, in a case in which the etching liquid is supplied to the etching target 96 without supplying the chemical compound to the etching target 96, when the temperature of the etching liquid is raised, the difference between the minimum value and the maximum value of etching speeds of silicon increases. On the contrary, in a case in which the etching liquid is supplied to the etching target 96 without supplying the chemical compound to the etching target 96, when the temperature of the etching liquid is lowered, the difference between the minimum value and the maximum value of etching speeds of silicon decreases. These phenomena also occur when the etching liquid and the chemical compound are supplied to the etching target 96. Thus, the temperatures of the etching liquid and the chemical compound may be set in accordance with the required quality and the allowable processing time.

Figure 6:
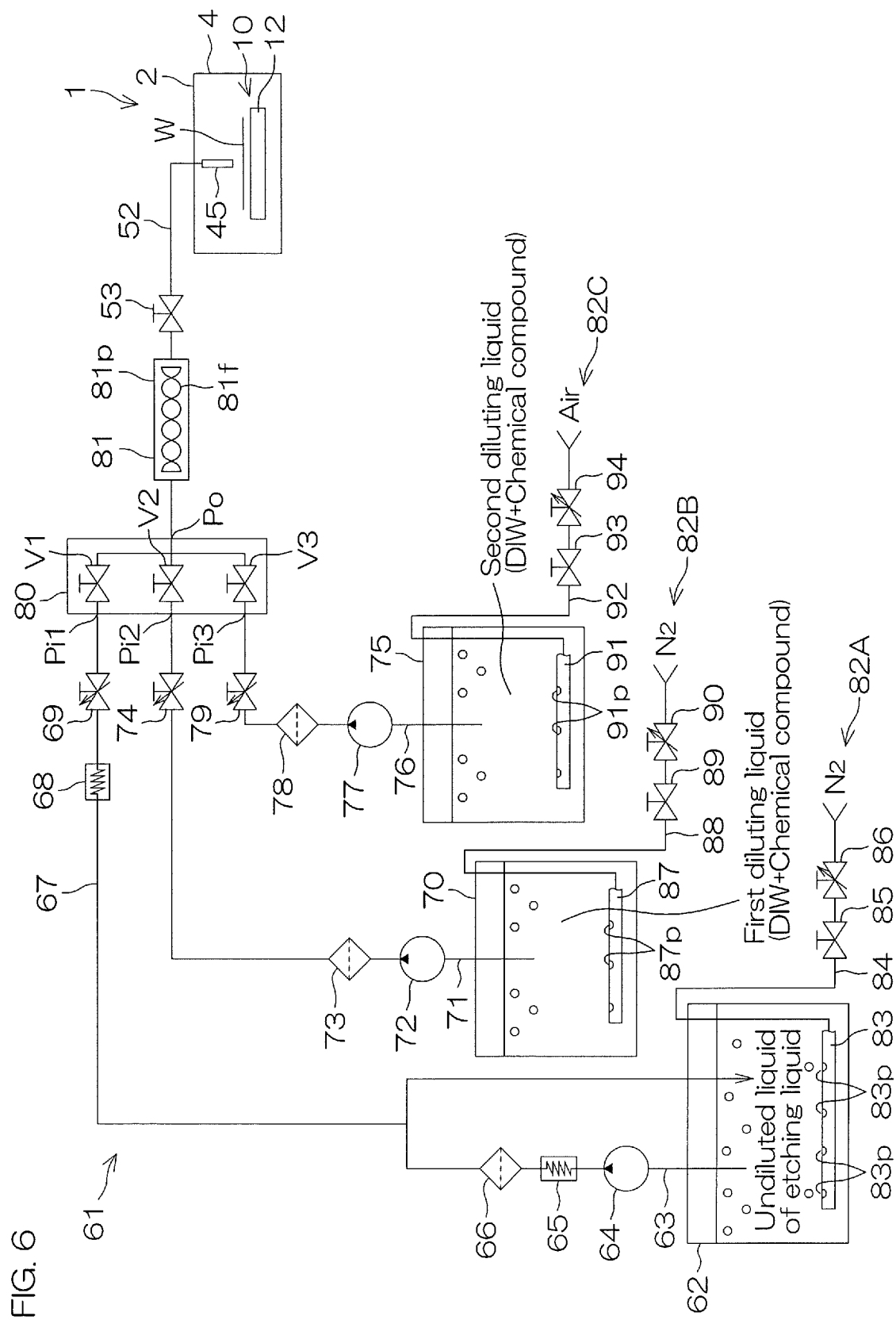
FIG. 6 is a schematic view showing a processing liquid supplying unit of the substrate processing apparatus that supplies the substrate with the processing liquid such as the etching liquid.

FIG. 6 is a schematic view showing a processing liquid supplying unit 61 of the substrate processing apparatus 1 that supplies the substrate W with the processing liquid such as the etching liquid. FIG. 6 shows an example in which the etching liquid is mixed with the chemical compound before being supplied to the substrate W.

The substrate processing apparatus 1 includes the processing liquid supplying unit 61 that supplies the substrate W with the processing liquid such as the etching liquid. The center nozzle 45, the etching liquid piping 52, the etching liquid valve 53, etc., described above are included in the processing liquid supplying unit 61. the processing liquid supplying unit 61 is an example of the first etching unit and the second etching unit.

The processing liquid supplying unit 61 includes, in addition to the center nozzle 45 and so on, the processing liquid supplying unit 61 includes, in addition to the center nozzle 45 and so on, an undiluted liquid tank 62 that stores alkaline undiluted liquid of the etching liquid (alkaline etching liquid that is not diluted), a first diluting liquid tank 70 that stores first diluting liquid to dilute the undiluted liquid of the etching liquid, and a second diluting liquid tank 75 that stores second diluting liquid to dilute the undiluted liquid of the etching liquid.

The first diluting liquid and the second diluting liquid are liquids having the same components and different dissolved oxygen concentrations. FIG. 6 shows an example where the pure water (DIW) in which the chemical compound described above is dissolved is the first diluting liquid and the second diluting liquid. the dissolved oxygen concentration of the first diluting liquid is lower than the dissolved oxygen concentration of the second diluting liquid. As long as the concentration of hydroxide is lower than that of the undiluted liquid of the etching liquid, the first diluting liquid and the second diluting liquid may be alkaline etching liquid.

The undiluted liquid in the undiluted liquid tank 62 is supplied to the center nozzle 45 via a mixing valve 80. Similarly, the first diluting liquid in the first diluting liquid tank 70 is supplied to the center nozzle 45 via the mixing valve 80, and the second diluting liquid in the second diluting liquid tank 75 is supplied to the center nozzle 45 via the mixing valve 80. The undiluted liquid of the etching liquid is mixed with at least one of the first diluting liquid and the second diluting liquid at the inside of the mixing valve 80. Thus, the diluted undiluted liquid, that is, the etching liquid is produced and supplied to the center nozzle 45.

The processing liquid supplying unit 61 may include an inline mixer 81 that stirs the etching liquid that has passed through the mixing valve 80 before being discharged from the center nozzle 45. FIG. 6 shows an example in which the inline mixer 81 is disposed upstream of the etching liquid valve 53. The inline mixer 81 is a static mixer that includes a pipe 81p interposed in an undiluted liquid piping 67 and a stirring fin 81f disposed in the pipe 81p and twisted around an axis extending a flow direction of liquid.

The processing liquid supplying unit 61 includes circulation piping 63 that circulate the etching liquid in the undiluted liquid tank 62, a circulation pump 64 that sends the etching liquid in the undiluted liquid tank 62 to the circulation piping 63, a filter 66 that removes foreign matters such as particles from the etching liquid returning to the undiluted liquid tank 62, and a temperature controller 65 that changes the temperature of the etching liquid in the undiluted liquid tank 62 by heating or cooling the etching liquid.

The circulation pump 64 always sends the etching liquid in the undiluted liquid tank 62 into the circulation piping 63. The etching liquid in the undiluted liquid tank 62 flows in the circulation piping 63 through the upstream end of the circulation piping 63 and returns to the undiluted liquid tank 62 through the downstream end of the circulation piping 63. Thus, the etching liquid circulates in a circulation path that is formed by the undiluted liquid tank 62 and the circulation piping 63.

The temperature controller 65 maintains the temperature of the etching liquid in the undiluted liquid tank 62 at a constant temperature higher or lower than a room temperature (for example, 20 to 30 degrees Celsius). The temperature controller 65 may be interposed in the circulation piping 63, or may be disposed in the undiluted liquid tank 62. FIG. 6 shows an example of the former. The temperature controller 65 may be a heater that heats liquid at a temperature higher than the room temperature, or may be a cooler that cools liquid at a temperature lower than the room temperature, or may have both heating and cooling functions.

The processing liquid supplying unit 61 further includes the undiluted liquid piping 67 that guide the etching liquid toward the center nozzle 45 from the circulation piping 63, a flow rate adjusting valve 69 that changes the flow rate of the etching liquid flowing downstream in the undiluted liquid piping 67, and an inline heater 68 that heats the etching liquid that has flowed in the undiluted liquid piping 67.

The etching liquid in the circulation piping 63 flows in the undiluted liquid piping 67 through the upstream end of the undiluted liquid piping 67 and is supplied to the mixing valve 80 through the downstream end of the undiluted liquid piping 67. At this time, the etching liquid is supplied to the mixing valve 80 at a flow rate corresponding to the degree of opening of the flow rate adjusting valve 69. When the etching liquid having the temperature higher than the temperature of the etching liquid in the undiluted liquid tank 62 is supplied to the mixing valve 80, the etching liquid is supplied to the mixing valve 80 after being heated by the inline heater 68.

The processing liquid supplying unit 61 includes first diluting liquid piping 71 that guide the first diluting liquid toward the center nozzle 45 from the first diluting liquid tank 70, a first diluting liquid pump 72 that sends the first diluting liquid in the first diluting liquid tank 70 to the first diluting liquid piping 71, a filter 73 that removes foreign matters such as particles from the first diluting liquid flowing toward the center nozzle 45, and a flow rate adjusting valve 74 that changes the flow rate of the first diluting liquid flowing downstream in the first diluting liquid piping 71.

The processing liquid supplying unit 61 further includes second diluting liquid piping 76 that guide the second diluting liquid toward the center nozzle 45 from the second diluting liquid tank 75, a second diluting liquid pump 77 that sends the second diluting liquid in the second diluting liquid tank 75 to the second diluting liquid piping 76, a filter 78 that removes foreign matters such as particles from the second diluting liquid flowing toward the center nozzle 45, and a flow rate adjusting valve 79 that changes the flow rate of the second diluting liquid flowing downstream in the second diluting liquid piping 76.

When the first diluting liquid in the first diluting liquid tank 70 is circulated, a configuration similar to that of the etching liquid may be adopted. That is, the circulation pipe 63 and the circulation pump 64 for the first diluting liquid may be provided. When the first diluting liquid having a temperature higher or lower than room temperature is supplied to the mixing valve 80, at least one of the temperature controller 65 and the inline heater 68 for the first diluting liquid may be provided. When the dissolved oxygen concentration of the first diluting liquid is lowered, the gas piping 83 and so on for the first diluting liquid may be provided. The same applies to the second diluting liquid.

The mixing valve 80 includes a plurality of valves that are individually openable and closable and a plurality of flow paths that are connected to the plurality of valves. FIG. 6 shows an example in which the mixing valve 80 includes three valves (the first valve V1, the second valve V2, and the third valve V3), three inflow ports (the first inflow port Pi1, the second inflow port Pi2, and the third inflow port Pi3), and an outflow port Po. The undiluted liquid piping 67 is connected to the first inflow port Pi1. The first diluting liquid piping 71 is connected to the second inflow port Pi2, and the second diluting liquid piping 76 is connected to the third inflow port Pi3. The etching liquid piping 52 is connected to the outflow port Po.

When the first valve V1 is opened, the etching liquid in the undiluted liquid piping 67 flows into the mixing valve 80 through the first inflow port Pi1 and is discharged to the etching liquid piping 52 from the outflow port Po. Similarly, when the second valve V2 is opened, the first diluting liquid in the first diluting liquid piping 71 flows into the mixing valve 80 through the second inflow port Pi2 and is discharged to the etching liquid piping 52 from the outflow port Po. When the third valve V3 is opened, the second diluting liquid in the second diluting liquid piping 76 flows into the mixing valve 80 through the third inflow port Pi3 and is discharged to the etching liquid piping 52 from the outflow port Po.

When the first valve V1 and the second valve V2 are opened, the undiluted liquid is supplied to the mixing valve 80 at a flow rate corresponding to the degree of opening of the flow rate adjusting valve 69, and the first diluting liquid is supplied to the mixing valve 80 at a flow rate corresponding to the degree of opening of the flow rate adjusting valve 74. Thus, the undiluted liquid of the etching liquid diluted with the first diluting liquid is supplied to the etching liquid piping 52 from the mixing valve 80 and discharged toward the substrate W from the center nozzle 45.

When the first valve V1 and the third valve V3 are opened, the undiluted liquid is supplied to the mixing valve 80 at a flow rate corresponding to the degree of opening of the flow rate adjusting valve 69, and the second diluting liquid is supplied to the mixing valve 80 at a flow rate corresponding to the degree of opening of the flow rate adjusting valve 79. Thus, the undiluted liquid of the etching liquid diluted with the second diluting liquid is supplied to the etching liquid piping 52 from the mixing valve 80 and is discharged toward the substrate W from the center nozzle 45.

When the first valve V1, the second valve V2 and the third valve V3 are opened, the undiluted liquid, the first diluting liquid and the second diluting liquid are supplied to the mixing valve 80, and the undiluted liquid of the etching liquid diluted with the first diluting liquid and the second diluting liquid is supplied to the etching liquid piping 52 from the mixing valve 80. The ratio of the first diluting liquid and the second diluting liquid contained in the etching liquid is adjusted by the opening degrees of the flow rate adjusting valve 74 and the flow rate adjusting valve 79.

When diluting the undiluted liquid with any diluting liquid, the ratio of the diluting liquid (at least one of the first diluting liquid and the second diluting liquid) to the undiluted liquid is constant. For example, if the ratio of the diluting liquid when the undiluted liquid is diluted with only the first diluting liquid (volume of the diluting liquid/volume of the undiluted liquid) is the ratio X, the ratio of the diluted liquid when the undiluted liquid is diluted with only the second diluting liquid is also the ratio X. the ratio of the diluted liquid when the undiluted liquid is diluted with both the first diluting liquid and the second diluting liquid is also the ratio X. Thus, if the amount of the undiluted liquid supplied to the mixing valve 80 is constant, the undiluted liquid is diluted with a fixed amount of the diluting liquid. The proportion of the undiluted liquid in the etching liquid may be smaller or larger than the proportion of diluting liquid in the etching liquid, or may be equal to the proportion of diluting liquid in the etching liquid.

The substrate processing apparatus 1 includes a dissolved oxygen concentration changing unit that adjusts the dissolved oxygen concentration of the etching liquid. FIG. 6 shows an example in which the dissolved oxygen concentration changing unit includes an adjusting unit 82A for the undiluted liquid that adjusts the dissolved oxygen concentration of the undiluted liquid, an adjusting unit 82B for the first diluting liquid that adjusts the dissolved oxygen concentration of the first diluting liquid, and an adjusting unit 82C for the second diluting liquid that adjusts the dissolved oxygen concentration of the second diluting liquid.

The adjusting unit 82A for the undiluted liquid includes gas piping 83 that dissolve gas in the undiluted liquid in the undiluted liquid tank 62 by supplying gas into the undiluted liquid tank 62. the adjusting unit 82A for the undiluted liquid further includes inert gas piping 84 that supplies inert gas to the gas piping 83, an inert gas valve 85 that opens and closes between an open state where inert gas flows from the inert gas piping 84 to the gas piping 83 and a close state where inert gas is stopped at the inert gas piping 84, and a flow rate adjusting valve 86 that changes a flow rate of inert gas to be supplied to the gas piping 83 from the inert gas piping 84.

The gas piping 83 is bubbling piping that include gas discharge ports 83p disposed in the undiluted liquid in the undiluted liquid tank 62. When the inert gas valve 85 is switched to the open state from the close state, inert gas such as nitrogen gas is discharged from the gas discharge ports 83p at a flow rate corresponding to the degree of opening of the flow rate adjusting valve 86. Thus, a large number of air bubbles are formed in the undiluted liquid in the undiluted liquid tank 62, and inert gas is dissolved in the undiluted liquid in the undiluted liquid tank 62. Here, the dissolved oxygen is discharged from the undiluted liquid, and the dissolved oxygen concentration of the undiluted liquid is lowered. The dissolved oxygen concentration of the undiluted liquid in the undiluted liquid tank 62 is changed by changing the flow rate of the nitrogen gas discharged from the gas discharge ports 83p.

The adjusting unit 82B for the undiluted liquid includes gas piping 87 that dissolve gas in the first diluting liquid in the first diluting liquid tank 70 by supplying gas into the first diluting liquid tank 70. the adjusting unit 82B for the undiluted liquid further includes inert gas piping 88 that supplies inert gas to the gas piping 87, an inert gas valve 89 that opens and closes between an open state where inert gas flows from the inert gas piping 88 to the gas piping 87 and a close state where inert gas is stopped at the inert gas piping 88, and a flow rate adjusting valve 90 that changes a flow rate of inert gas to be supplied to the gas piping 87 from the inert gas piping 88.

The gas piping 87 is bubbling piping that include gas discharge ports 87p disposed in the first diluting liquid in the first diluting liquid tank 70. When the inert gas valve 89 is switched to the open state from the close state, inert gas such as nitrogen gas is discharged from the gas discharge ports 87p at a flow rate corresponding to the degree of opening of the flow rate adjusting valve 90. Thus, a large number of air bubbles are formed in the first diluting liquid in the first diluting liquid tank 70, and inert gas is dissolved in the first diluting liquid in the first diluting liquid tank 70. Here, the dissolved oxygen is discharged from the first diluting liquid, and the dissolved oxygen concentration of the first diluting liquid is lowered. The dissolved oxygen concentration of the first diluting liquid in the first diluting liquid tank 70 is changed by changing the flow rate of the nitrogen gas discharged from the gas discharge ports 87p.

The adjusting unit 82C for the undiluted liquid includes gas piping 91 that dissolve gas in the second diluting liquid in the second diluting liquid tank 75 by supplying gas into the second diluting liquid tank 75. the adjusting unit 82C for the undiluted liquid further includes oxygen piping 92 that supplies oxygen-containing gas containing oxygen to the gas piping 91, an oxygen valve 93 that opens and closes between an open state where the oxygen-containing gas flows from the oxygen piping 92 to the gas piping 91 and a close state where the oxygen-containing gas is stopped at the oxygen piping 92, and a flow rate adjusting valve 94 that changes a flow rate of the oxygen-containing gas to be supplied to the gas piping 91 from the oxygen piping 92. The oxygen-containing gas is an example of dissolution gas. The oxygen-containing gas may be oxygen gas, or may be mixed gas of oxygen gas and gas other than oxygen gas. FIG. 6 shows an example in which dry air (clean dry air) containing nitrogen and oxygen in a ratio of approximately 8:2 is the oxygen-containing gas.

The gas piping 91 is bubbling piping that include gas discharge ports 91*p* disposed in the second diluting liquid in the second diluting liquid tank 75. When the oxygen valve 93 is switched to the open state from the close state, the oxygen-containing gas is discharged from the gas discharge ports 91*p* at a flow rate corresponding to the degree of opening of the flow rate adjusting valve 94. Thus, a large number of air bubbles are formed in the second diluting liquid in the second diluting liquid tank 75, and the oxygen-containing gas is dissolved in the second diluting liquid in the second diluting liquid tank 75. Air contains oxygen at a rate of about 21 vol %, whereas nitrogen gas contains no oxygen or only a very small amount of oxygen. Thus, it is possible to increase the dissolved oxygen concentration of the second diluting liquid by dissolving the oxygen-containing gas in the second diluting liquid.

The dissolved oxygen concentration of the second diluting liquid is higher than the dissolved oxygen concentration of the first diluting liquid and is higher than the dissolved oxygen concentration of the undiluted liquid. the dissolved oxygen concentration of the first diluting liquid may be higher or lower than the dissolved oxygen concentration of the undiluted liquid, or may be equal to the dissolved oxygen concentration of the undiluted liquid. the dissolved oxygen concentration of the first diluting liquid and the dissolved oxygen concentration of the undiluted liquid is 2 ppm or less, for example. the dissolved oxygen concentration of the second diluting liquid is 6 to 7 ppm, for example. the dissolved oxygen concentration of the undiluted liquid diluted only with the first diluting liquid is 2 ppm or less, for example. the dissolved oxygen concentration of the undiluted liquid diluted only with the second diluting liquid is a valve between the dissolved oxygen concentration of the undiluted liquid and the dissolved oxygen concentration of the second diluting liquid.

When the dissolved oxygen concentration of the undiluted liquid diluted only with the first diluting liquid is the first dissolved oxygen concentration, and the dissolved oxygen concentration of the undiluted liquid diluted only with the second diluting liquid is the second dissolved oxygen concentration, if the undiluted liquid is diluted with both the first diluting liquid and the second diluting liquid, it is possible to make the etching liquid (the undiluted liquid diluted with the first diluting liquid and the second diluting liquid) having the dissolved oxygen concentration between the first dissolved oxygen concentration and the second dissolved oxygen concentration. Further, it is possible to change the dissolved oxygen concentration of the etching liquid between the first dissolved oxygen concentration and the second dissolved oxygen concentration by changing the ratios of the first diluting liquid and the second diluting liquid.

First etching liquid described below means the undiluted liquid of the etching liquid diluted only with the first diluting liquid or with the first diluting liquid and the second diluting liquid. Second etching liquid described below means the undiluted liquid of the etching liquid diluted only with the second diluting liquid or with the first diluting liquid and the second diluting liquid. In a case where both the first etching liquid and the second etching liquid contain the first diluting liquid and the second diluting liquid, the ratios of the first diluting liquid and the second diluting liquid are adjusted so that the dissolved oxygen concentration of the second etching liquid is higher than the dissolved oxygen concentration of the first etching liquid.

Figure 7:
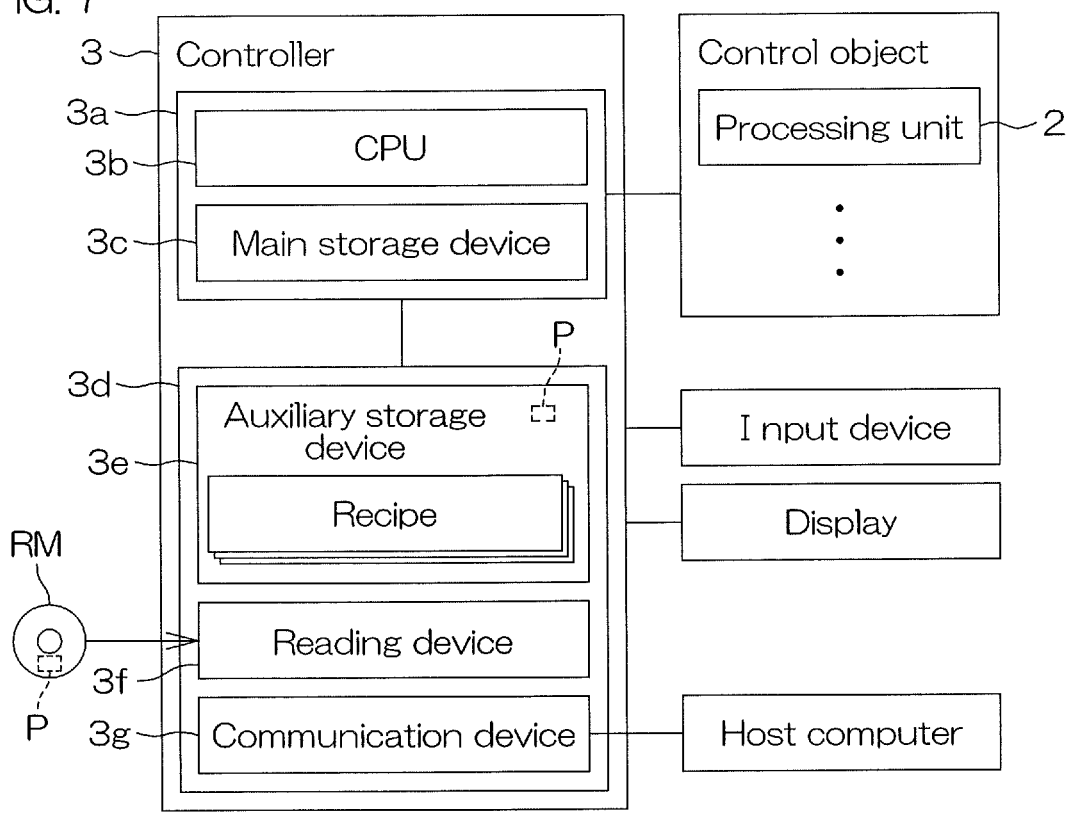
FIG. 7 is a block diagram showing an electrical arrangement of the substrate processing apparatus.

FIG. 7 is a block diagram showing an electrical arrangement of the substrate processing apparatus 1.

The controller 3 is a computer which includes a computer main body 3*a* and a peripheral device 3*d* which is connected to the computer main body 3*a*. The computer main body 3*a* includes a CPU 3*b* (central processing unit) which executes various types of commands and a main storage device 3*c* which stores information. The peripheral device 3*d* includes an auxiliary storage device 3*e* which stores information such as a program P, a reading device 3*f* which reads information from a removable medium RM and a communication device 3*g* which communicates with other devices such as a host computer.

The controller 3 is connected to an input device and a display. The input device is operated when an operator such as a user or a maintenance operator inputs information to the substrate processing apparatus 1. The information is displayed on the screen of the display. The input device may be any one of a keyboard, a pointing device and a touch panel or may be a device other than those. A touch panel display which serves both as the input device and the display may be provided in the substrate processing apparatus 1.

The CPU 3*b* executes the program P stored in the auxiliary storage device 3*e*. The program P within the auxiliary storage device 3*e* may be previously installed in the controller 3, may be fed through the reading device 3*f* from the removable medium RM to the auxiliary storage device 3*e* or may be fed from an external device such as the host computer to the auxiliary storage device 3*e* through the communication device 3*g*.

The auxiliary storage device 3*e* and the removable medium RM are nonvolatile memories which retain memory even without power being supplied. The auxiliary storage device 3*e* is, for example, a magnetic storage device such as a hard disk drive. The removable medium RM is, for example, an optical disc such as a compact disc or a semiconductor memory such as a memory card. The removable medium RM is an example of a computer readable recording medium in which the program P is recorded. The removable medium RM is a non-transitory tangible recording medium (non-transitory tangible media).

The auxiliary storage device 3*e* stores a plurality of recipes. The recipe is information which specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed in accordance with the recipe designated by the host computer. The controller 3 is programmed to execute the individual steps described below.

FIG. 8 is a process chart for describing an example of the processing of the substrate W which is executed by the substrate processing apparatus 1. Reference is hereinafter made to FIG. 1A, FIG. 2, FIG. 3, FIG. 6 and FIG. 8.

When the substrate W is processed by the substrate processing apparatus 1, a carry-in step of carrying the substrate W into the chamber 4 is performed (step S1 in FIG. 8).

Specifically, in a state where the raising/lowering frame 32 and the shielding member 33 are positioned in the upper position and where all the guards 25 are positioned in the lower position, the center robot CR causes the hand H1 to enter the chamber 4 while supporting the substrate W with the hand H1. Then, the center robot CR places, on the chuck pins 11, the substrate W on the hand H1 with the front surface of the substrate W directed upward. Thereafter, the chuck pins 11 are pressed onto the outer circumferential surface of the substrate W, and thus the substrate W is grasped. The center robot CR places the substrate W on the spin chuck 10 and thereafter retracts the hand H1 from the inside of the chamber 4.

Next, the upper gas valve 57 and the lower gas valve 21 are opened, and thus the upper central opening 38 of the shielding member 33 and the lower central opening 18 of the spin base 12 start the discharge of the nitrogen gas. Thus, the oxygen concentration in the atmosphere in contact with the substrate W is reduced. Furthermore, the shielding member raising/lowering unit 31 lowers the raising/lowering frame 32 from the upper position to the lower position, and the guard raising/lowering unit 27 raises any one of the guards 25 from the lower position to the upper position. Here, the spin base 12 is held at such a reference rotational angle where the upper support portions 43 respectively overlap the lower support portions 44 in plan view. Thus, the upper support portions 43 of the shielding member 33 are supported on the lower support portions 44 of the spin base 12, and the shielding member 33 is separated from the raising/lowering frame 32. Thereafter, the spin motor 14 is driven to start the rotation of the substrate W (step S2 in FIG. 8).

Next, a chemical liquid supplying step of supplying the upper surface of the substrate W with DHF which is an example of the chemical liquid is performed (step S3 in FIG. 8).

Specifically, in a state where the shielding member 33 is positioned in the lower position, the chemical liquid valve 51 is opened, and thus the center nozzle 45 starts the discharge of the DHF. The DHF discharged from the center nozzle 45 hits the central portion of the upper surface of the substrate W and thereafter flows outward along the upper surface of the substrate W which is being rotated. Thus, a liquid film of the DHF which covers the entire region of the upper surface of the substrate W is formed, and the DHF is supplied to the entire region of the upper surface of the substrate W. When a predetermined time has elapsed since the chemical liquid valve 51 is opened, the chemical liquid valve 51 is closed, and the discharge of the DHF is stopped.

Next, a first rinse liquid supplying step of supplying the upper surface of the substrate W with pure water which is an example of the rinse liquid is performed (step S4 in FIG. 8).

Specifically, in a state where the shielding member 33 is positioned in the lower position, the upper rinse liquid valve 55 is opened, and thus the center nozzle 45 starts the discharge of the pure water. The pure water that has hit the central portion of the upper surface of the substrate W flows outward along the upper surface of the substrate W that is being rotated. The DHF on the substrate W is rinsed off by the pure water discharged from the center nozzle 45. Thus, a liquid film of the pure water which covers the entire region of the upper surface of the substrate W is formed. When a predetermined time has elapsed since the upper rinse liquid valve 55 is opened, the upper rinse liquid valve 55 is closed, and the discharge of the pure water is stopped.

Next, a first etching step of supplying the upper surface of the substrate W with first etching liquid which is an example of the etching liquid is performed (step S5 in FIG. 8).

Specifically, in a state where the shielding member 33 is positioned at the lower position, the first valve V1 and the second valve V2 of the mixing valve 80 are opened, and the etching liquid valve 53 is opened. Thus, the first etching liquid, that is, the undiluted liquid of the etching liquid diluted with the first diluting liquid is supplied to the center nozzle 45, and the center nozzle 45 starts to discharge the first etching liquid. Before the start of the discharge of the first etching liquid, in order to switch the guards 25 which receive the liquid discharged from the substrate W, the guard raising/lowering unit 27 may vertically move at least one of the guards 25. The first etching liquid that has hit the central portion of the upper surface of the substrate W flows outward along the upper surface of the substrate W that is being rotated. The pure water on the substrate W is replaced by the first etching liquid discharged from the center nozzle 45. Thus, a liquid film of the first etching liquid which covers the entire region of the upper surface of the substrate W is formed.

After the liquid film of the first etching liquid is formed, a second etching step of supplying the upper surface of the substrate W with second etching liquid which is another example of the etching liquid (step S6 in FIG. 8).

Specifically, the first valve V1 of the mixing valve 80 and the etching liquid valve 53 remain open, the second valve V2 of the mixing valve 80 is closed and the third valve V3 of the mixing valve 80 is opened. At this time, if necessary, the degree of opening of the flow rate adjusting valve 69 (refer to FIG. 6) may be changed. When the second valve V2 of the mixing valve 80 is closed and the third valve V3 of the mixing valve 80 is opened, the supply of the first diluting liquid to the mixing valve 80 is stopped and the supply of the second diluting liquid to the mixing valve 80 is started. Thus, the second etching liquid, that is, the undiluted liquid of the etching liquid diluted with the second diluting liquid is supplied to the center nozzle 45, and the center nozzle 45 starts to discharge the second etching liquid. Before the start of the discharge of the second etching liquid, in order to switch the guards 25 which receive the liquid discharged from the substrate W, the guard raising/lowering unit 27 may vertically move at least one of the guards 25.

The second etching liquid is discharged toward the central portion of the upper surface of the substrate W from the center nozzle 45 in a state where the shielding member 33 is positioned at the lower position. The second etching liquid that has hit the central portion of the upper surface of the substrate W flows outward along the upper surface of the substrate W which is being rotated. The first etching liquid on the substrate W is replaced with the second etching liquid discharged from the center nozzle 45. Thus, a liquid film of the second etching liquid which covers the entire region of the upper surface of the substrate W is formed. After that, all the valves of the mixing valve 80 (the first valve V1, the second valve V2 and the third valve V3) are closed and the etching liquid valve 53 is closed. Thus, the discharge of the second etching liquid from the center nozzle 45 is stopped in a state where the entire region of the upper surface of the substrate W is covered with the liquid film of the second etching liquid.

Next, a second rinse liquid supplying step of supplying the upper surface of the substrate W with pure water which is an example of the rinse liquid is performed (step S7 in FIG. 8).

Specifically, in the state where the shielding member 33 is positioned in the lower position, the upper rinse liquid valve 55 is opened, and thus the center nozzle 45 starts the discharge of the pure water. The pure water that has hit the central portion of the upper surface of the substrate W flows outward along the upper surface of the substrate W that is being rotated. The second etching liquid on the substrate W is rinsed off by the pure water discharged from the center nozzle 45. Thus, a liquid film of the pure water which covers the entire region of the upper surface of the substrate W is formed. When a predetermined time has elapsed since the upper rinse liquid valve 55 is opened, the upper rinse liquid valve 55 is closed, and the discharge of the pure water is stopped.

Next, a drying step of drying the substrate W by the rotation of the substrate W is performed (step S8 in FIG. 8).

Specifically, in the state where the shielding member 33 is positioned in the lower position, the spin motor 14 accelerates the substrate W in the rotation direction so as to rotate the substrate W at a high rotational speed (for example, several thousands of rpm) higher than the rotational speed of the substrate W in a period from the chemical liquid supplying step to the second rinse liquid supplying step. Thus, the liquid is removed from the substrate W, and thus the substrate W is dried. When a predetermined time has elapsed since the high-speed rotation of the substrate W is started, the spin motor 14 stops the rotation. Here, the spin motor 14 stops the spin base 12 at the reference rotational angle. Thus, the rotation of the substrate W is stopped (step S9 in FIG. 8).

Next, a carry-out step of carrying the substrate W out from the chamber 4 is performed (step S10 in FIG. 8).

Specifically, the shielding member raising/lowering unit 31 raises the raising/lowering frame 32 to the upper position, and the guard raising/lowering unit 27 lowers all the guards 25 to the lower position. Furthermore, the upper gas valve 57 and the lower gas valve 21 are closed, and thus the upper central opening 38 of the shielding member 33 and the lower central opening 18 of the spin base 12 stop the discharge of the nitrogen gas. Thereafter, the center robot CR causes the hand H1 to enter the chamber 4. After the chuck pins 11 release the grasping of the substrate W, the center robot CR supports the substrate W on the spin chuck 10 with the hand H1. Thereafter, the center robot CR retracts the hand H1 from the inside of the chamber 4 while supporting the substrate W with the hand H1. Thus, the processed substrate W is carried out from the chamber 4.

Figure 9A:
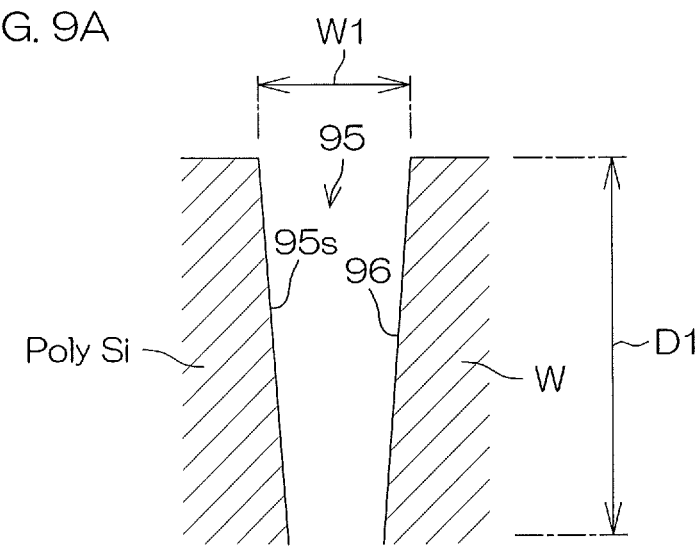
FIG. 9A, FIG. 9B and FIG. 9C are schematic views showing examples of a cross-section of the substrate.
Figure 9B:
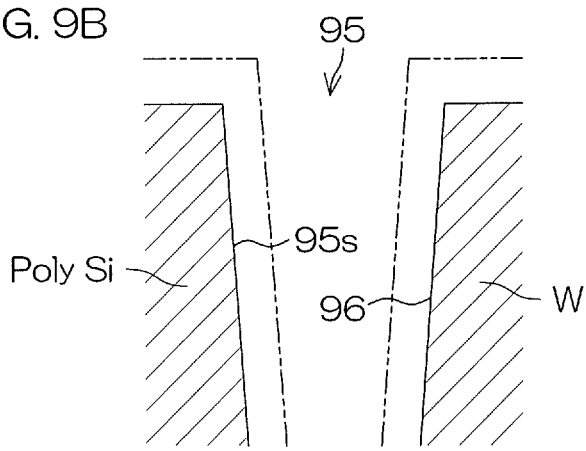
Figure 9C:
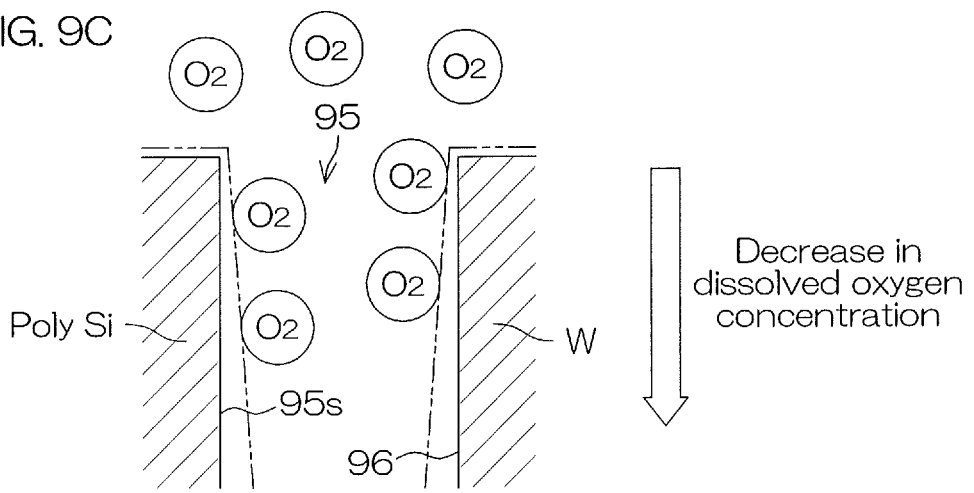

FIG. 9A is a schematic view showing an example of a cross-section of the substrate W before the first etching liquid is supplied in the example of the processing of the substrate W shown in FIG. 8. FIG. 9B is a schematic view showing an example of a cross-section of the substrate W after the first etching liquid is supplied in the example of the processing of the substrate W shown in FIG. 8. FIG. 9C is a schematic view showing an example of a cross-section of the substrate W after the second etching liquid is supplied in the example of the processing of the substrate W shown in FIG. 8.

When acidic chemical liquid such as DHF is supplied to the substrate W in the chemical liquid supplying step (step S3 in FIG. 8), a native oxide film is removed from the front surface of the substrate W. FIG. 9A shows an example of a cross-section of the substrate W from which the native oxide film is removed. the cross-section of the substrate W shown in FIG. 9A is the same as the cross-section of the substrate W before the acidic chemical liquid is supplied to the substrate W. A recess 95 is formed on the front surface of the substrate W before the acidic chemical liquid is supplied. The recess 95 is recessed from the outermost surface of the substrate W in the thickness direction of the substrate W. The recess 95 may be a hole or may be a groove extending in the surface direction of the substrate W.

The width W1 of the recess 95 is smaller than the depth D1 of the recess 95. In other words, the maximum value of the gap of the side surface 95s of the recess 95 is smaller than the length of the side surfaces 95s in the depth direction of the recess 95. the width W1 of the recess 95 before the substrate W is processed by the substrate processing apparatus 1 may be constant from the entrance of the recess 95 to the bottom of the recess 95, or may vary. FIG. 9A shows an example in which the width W1 of the recess 95 continuously decreases as the bottom of the recess 95 is approached. This decrease in the width W1 occurs not in the supply of the acidic chemical liquid in the substrate processing apparatus 1, but in a preceding step performed before the substrate W is carried in the substrate processing apparatus 1 such as a dry etching step.

The width W1 of the recess 95 (the maximum value if the width W1 of the recess 95 is not uniform) is 30 to 2000 nm, for example. the depth D1 of the recess 95 is 60 to 4000 nm, for example. The aspect ratio of the recess 95 (the depth D1 of the recess 95/the width W1 of the recess 95) is 2 to 200, for example. When the width W1 of the recess 95 continuously decreases as the bottom of the recess 95 is approached, the difference between the maximum value of the width W1 of the recess 95 and the minimum value of the width W1 of the recess 95 is 1 to 200 nm, for example.

FIG. 9A shows an example in which the entire region of the side surface 95s of the recess 95 is formed of polysilicon which is an example of the etching target 96. the entire region of the side surface 95s of the recess 95 may be formed of the etching target 96, or only a portion of the side surface 95s of the recess 95 may be formed of the etching target 96. In the latter case, it is sufficient that the etching target 96 is exposed on at least a portion of the upper portion of the side surface 95s and at least a portion of the lower portion of the side surface 95s. In this case, a portion of the side surface 95s may be formed of a material other than the etching object 96, and the remaining portion of the side surface 95s may be formed of the etching object 96. The upper portion of the side surface 95s is a portion above the position that bisects the side surface 95s in the depth direction of the recess 95. The lower portion of the side surface 95s is a portion below the position that bisects the side surface 95s in the depth direction of the recess 95.

When the acidic chemical liquid is supplied to the substrate W in the chemical liquid supplying step (step S3 in FIG. 8), a native oxide film of polysilicon, that is, a silicon oxide film is removed from the side surface 95s of the recess 95. After that, the first etching liquid, which is alkaline etching liquid having low dissolved oxygen concentration, is supplied to the substrate W (step S5 in FIG. 8). Since the dissolved oxygen concentration of the first etching liquid is low, polysilicon exposed on the side surface 95s of the recess 95 is less likely to be oxidized by the dissolved oxygen in the first etching liquid Thus, when the first etching liquid is supplied to the substrate W, the side surface 95s of the recess 95 is uniformly etched at a high etching speed.

FIG. 9B shows with alternate long and two short dashes lines a cross-section of the substrate W after the acidic chemical liquid is supplied and before the first etching liquid is supplied, and shows with continuous lines a cross-section of the substrate W after the first etching liquid is supplied. Since the width W1 of the recess 95 continuously decreases as the bottom of the recess 95 is approached and the side surface 95s of the recess 95 is uniformly etched by the supply of the first etching liquid, the width W1 of the recess 95 continuously decreases as the bottom of the recess 95 is approached even after the first etching liquid is supplied.

After the first etching liquid is supplied to the substrate W, the second etching liquid, which is alkaline etching liquid having dissolved oxygen concentration higher than that of the first etching liquid, is supplied to the substrate W (step S6 in FIG. 8). Thus, all or almost all of the first etching liquid in contact with the substrate W is replaced with the second etching liquid, and the second etching liquid enters the recess 95. FIG. 9C shows with alternate long and two short dashes lines a cross-section of the substrate W after the first etching liquid is supplied and before the second etching liquid is supplied, and shows with continuous lines a cross-section of the substrate W after the second etching liquid is supplied.

As shown in FIG. 9C, when the second etching liquid is supplied to the recess 95, the dissolved oxygen contained in the second etching liquid ($O_2$ in FIG. 9) comes into contact with the side surface 95s of the recess 95 near the entrance of the recess 95 and oxidizes polysilicon which is an example of the etching target 96. Thus, although the amount is small, the second etching liquid that has been lowered in dissolved oxygen concentration flows toward the bottom of the recess 95. Even at a position slightly away from the entrance of the recess 95, the dissolved oxygen of the second etching liquid comes into contact with the side surface 95s of the recess 95 and is consumed. As a result of such a phenomenon being repeated continuously, the dissolved oxygen concentration of the second etching liquid continuously decreases as the bottom of the recess is approached.

Since the dissolved oxygen concentration of the second etching liquid is relatively high, when the second etching liquid is supplied to the substrate W, the side surface 95s of the recess 95 is oxidized by the dissolved oxygen of the second etching liquid. As described above, the dissolved oxygen concentration of the second etching liquid decreases as the bottom of the recess 95 is approached. If positions in the depth direction of the recess 95 are the same, the side surface 95s of the recess 95 is uniformly oxidized. However, the oxidation amount of the side surface 95s of the recess 95 decreases as the bottom of the recess 95 is approached. When polysilicon is oxidized, it changes to silicon oxide which is not easily corroded by alkaline etching liquid. Silicon single crystal and amorphous silicon also change to silicon oxide when being oxidized. Thus, as can be seen by comparing continuous lines and alternate long and two short dashes lines in FIG. 9C, the etching amount of the side surface 95s of the recess 95 increases as the bottom of the recess 95 is approached.

Since the etching amount of the side surface 95s of the recess 95 increases as the bottom of the recess 95 is approached, even when the width W1 of the recess 95 before the substrate W is processed by the substrate processing apparatus 1 continuously decreases as the bottom of the recess 95 is approached, after the second etching liquid is supplied, the width W1 of the recess 95 becomes uniform from the entrance of the recess 95 to the bottom of the recess 95 or non-uniformity of the width W1 of the recess 95 is reduced. Thus, even if the shape of the recess 95 when carried in the substrate processing apparatus 1 is different from the intended shape, it is possible to match or approximate the shape of the recess 95 to the intended shape after the second etching liquid is supplied.

As described above, it is possible to uniformly etch the side surface 95s of the recess 95 from the entrance of the recess 95 to the bottom of the recess 95 by supplying the recess 95 with the alkaline etching liquid having low dissolved oxygen concentration. On the other hand, it is possible to increase the etching amount of the side surface 95s of the recess 95 as the bottom of the recess 95 is approached by supplying the recess 95 with the alkaline etching liquid having relatively high dissolved oxygen concentration. In this case, it is possible to increase or decrease the rate of change in etching amount by changing the dissolved oxygen concentration. Thus, it is possible to control the shape of the recess 95 after etching by changing the dissolved oxygen concentration of the etching liquid.

Figure 10A:
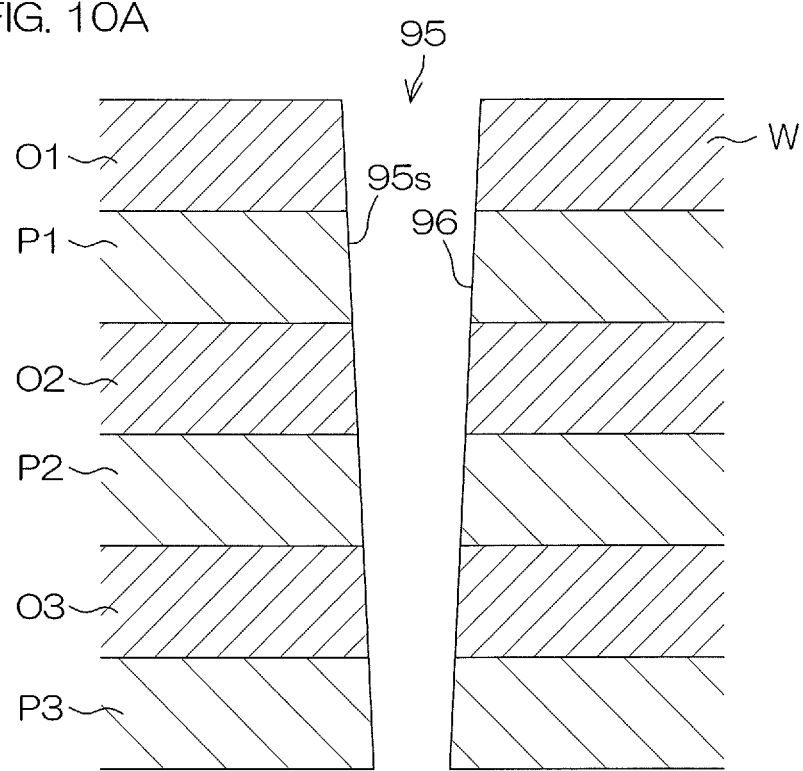
FIG. 10A is a schematic view showing another example of a cross-section of the substrate.
Figure 10B:
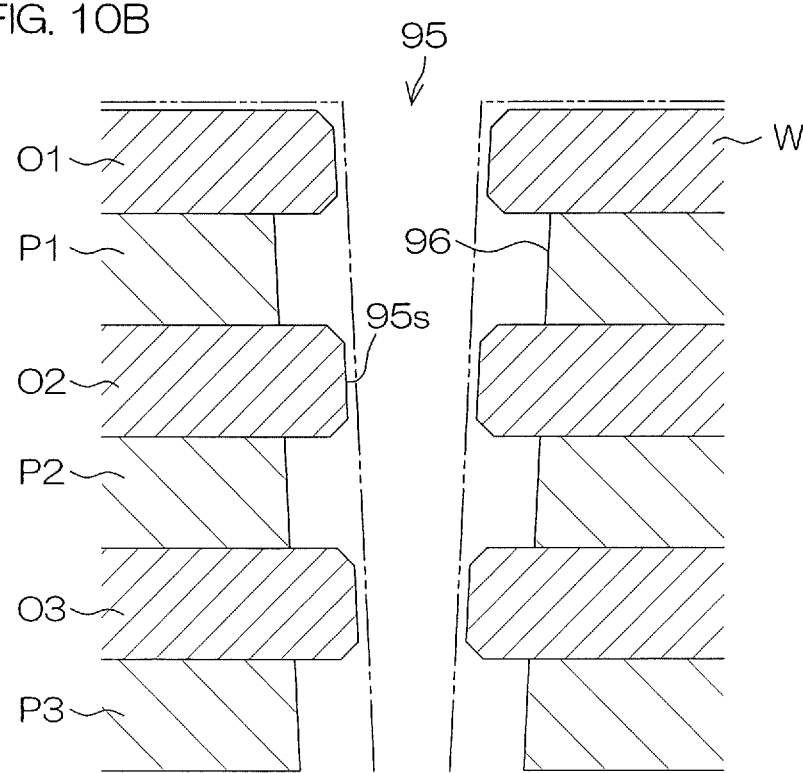
FIG. 10B is a schematic view showing another example of a cross-section of the substrate.

FIG. 10A is a schematic view showing another example of a cross-section of the substrate W before the first etching liquid is supplied in the example of the processing of the substrate W shown in FIG. 8. FIG. 10B is a schematic view showing another example of a cross-section of the substrate W after the first etching liquid is supplied in the example of the processing of the substrate W shown in FIG. 8. FIG. 10C is a schematic view showing another example of a cross-section of the substrate W after the second etching liquid is supplied in the example of the processing of the substrate W shown in FIG. 8.

In the examples shown in FIG. 10A to FIG. 10C, polysilicon films P1 to P3, which are examples of the etching target 96, and silicon oxide films O1 to O3, which are examples of the non-etching target, are exposed on the side surface 95s of the recess 95. the polysilicon films P1 to P3 and the silicon oxide films O1 to O3 are alternately stacked, and the recess 95 penetrates these films in the thickness direction of the substrate W.

FIG. 10B shows with alternate long and two short dashes lines a cross-section of the substrate W after the acidic chemical liquid such as DHF is supplied and before the first etching liquid is supplied, and shows with continuous lines a cross-section of the substrate W after the first etching liquid is supplied. the polysilicon films P1 to P3 are uniformly etched by the supply of the first etching liquid. At this time, the silicon oxide films O1 to O3 are also etched, although slightly.

After the first etching liquid is supplied to the substrate W, the second etching liquid, which is alkaline etching liquid having the dissolved oxygen concentration higher than that of the first etching liquid, is supplied to the substrate W. Thus, all or almost all of the first etching liquid in contact with the substrate W is replaced with the second etching liquid. FIG. 10C shows with alternate long and two short dashes lines a cross-section of the substrate W after the first etching liquid is supplied and before the second etching liquid is supplied, and shows with continuous lines a cross-section of the substrate W after the second etching liquid is supplied.

As shown in FIG. 10C, when the second etching liquid is supplied to the substrate W, the dissolved oxygen contained in the second etching liquid (refer to $O_2$ in FIG. 9) comes into contact with the polysilicon film P1 and the silicon oxide film O1 positioned near the entrance of the recess 95 and oxidizes the polysilicon film P1. Thus, although the amount is small, the second etching liquid that has been lowered in dissolved oxygen concentration flows toward the polysilicon film P2. As a result of such a phenomenon being repeated continuously, the dissolved oxygen concentration of the second etching liquid continuously decreases as the bottom of the recess is approached.

The dissolved oxygen concentration of the second etching liquid decreases as the polysilicon film P3, which is positioned on the bottom side of the recess 95, is approached. If positions in the depth direction of the recess 95 are the same, the polysilicon films P1 to P3 are uniformly oxidized. However, the oxidation amounts of the polysilicon films P1 to P3 decrease as the bottom of the recess 95 is approached. When polysilicon is oxidized, it changes to silicon oxide which is not easily corroded by alkaline etching liquid. Silicon single crystal and amorphous silicon also change to silicon oxide when being oxidized. Thus, as can be seen by comparing continuous lines and alternate long and two short dashes lines in FIG. 10C, the etching amounts of the polysilicon films P1 to P3 increase as the bottom of the recess 95 is approached.

Since the etching amount increases as the polysilicon film P3 is approached, even when the shape of the polysilicon films P1 to P3 when carried into the substrate processing apparatus 1 is different from the intended shape, it is possible to deform or approximate the shape of the polysilicon films P1 to P3 to the intended shape after supplying the second etching liquid.

As described above, in the present preferred embodiment, the alkaline first etching liquid in which the inert gas is dissolved is supplied to the substrate. Thus, the side surface 95s of the recess 95 formed on the substrate W is etched. Similarly, the alkaline second etching liquid in which the oxygen-containing gas, which is an example of the dissolution gas, is dissolved is supplied to the substrate. Thus, the side surface 95s of the recess 95 formed on the substrate W is etched. Accordingly, the side surface 95s of the recess 95 is etched step by step by supplying the first etching liquid and supplying the second etching liquid.

The etching target 96 representing at least one of silicon single crystal, polysilicon and amorphous silicon is exposed on the at least a portion of the upper portion of the side surface 95s of the recess 95 and the at least a portion of the lower portion of the side surface 95s of the recess 95. When liquid having high dissolved oxygen concentration is supplied to the etching target 96, the surface layer of the etching target 96 changes to silicon oxide. Silicon oxide is not etched or hardly etched by alkaline etching liquid.

Dissolved oxygen present in the first etching liquid has been removed from the first etching liquid by dissolution of the inert gas. Since the dissolved oxygen concentration of the first etching liquid is low, even if the first etching liquid comes into contact with the etching target 96, the etching target 96 is not oxidized or hardly oxidized. Thus, it is possible to uniformly etch the etching target 96 exposed on the side surface 95s of the recess 95 at a high etching speed by supplying the substrate W with the first etching liquid.

On the other hand, since the dissolved oxygen concentration of the second etching liquid is higher than the dissolved oxygen concentration of the first etching liquid, if the second etching liquid comes into contact with the etching target 96, the surface layer of the etching target 96 is oxidized and changes to silicon oxide which is not easily corroded by the second etching liquid. However, the entire region of the surface layer of the etching target 96 is not uniformly oxidized, but is non-uniformly oxidized.

That is, since the width W1 of the recess 95 is narrow, when the second etching liquid is supplied to the recess 95, the dissolved oxygen contained in the second etching liquid comes into contact with the etching target 96 near the entrance of the recess 95 and oxidizes the etching target 96. Thus, although the amount is small, the second etching liquid that has been lowered in dissolved oxygen concentration flows toward the bottom of the recess 95. Even at a position slightly away from the entrance of the recess 95, dissolved oxygen in the second etching liquid comes into contact with the etching target 96 and is consumed. As a result of such a phenomenon being repeated continuously, the dissolved oxygen concentration of the second etching liquid decreases as the bottom of the recess 95 is approached.

If positions in the depth direction of the recess 95 are the same, the etching target 96 is uniformly etched by the second etching liquid. However, the etching amount of the etching target 96 increases as the bottom of the recess 95 is approached. That is, since the surface layer of the etching target 96 has changed to silicon oxide near the entrance of the recess 95, the etching target 96 is less likely to be etched by the second etching liquid. On the other hand, since the surface layer of the etching target 96 is not changed or is hardly changed to silicon oxide near the bottom of the recess 95, the etching target 96 is etched by the second etching liquid. Thus, the etching amount of the etching target 96 near the bottom of the recess 95 is greater than the etching amount of the etching target 96 near the entrance of the recess 95.

As described above, it is possible to uniformly etch the etching target 96 exposed on the side surface 95s of the recess 95 at a high etching speed by supplying the substrate W with the first etching liquid. Further, it is possible to etch the etching target 96 so that the etching amount increases stepwise or continuously as the bottom of the recess 95 is approached by supplying the substrate W with the second etching liquid. Thus, it is possible to intentionally etch the side surface 95s of the recess 95 non-uniformly while reducing the increase in processing time by separately supplying the first etching liquid and the second etching liquid to the substrate.

In the present preferred embodiment, the first etching liquid having low dissolved oxygen concentration is supplied to the substrate, and then the second etching liquid having relatively high dissolved oxygen concentration is supplied to the substrate. When the second etching liquid is first supplied to the substrate, the etching target 96 exposed on the side surface 95s of the recess 95 is oxidized. Thus, when the first etching liquid is supplied, the etching target 96 is non-uniformly etched, or the etching speed is lowered. It is possible to shorten the processing time and bring the actual shape of the etching target 96 that has been etched closer to the intended shape by supplying the first etching liquid first compared to the case where the second etching liquid is first supplied.

In the present preferred embodiment, after the first etching liquid has been supplied to the substrate, the second etching liquid is supplied to the substrate W rather than supplying liquid other than the second etching liquid to the substrate. Thus, the first etching liquid that is in contact with the substrate W is replaced with the second etching liquid. If liquid other than the second etching liquid is supplied to the substrate W before the second etching liquid is supplied, the etching target 96 exposed on the side surface 95s of the recess 95 may be oxidized in an unintended manner. If the first etching liquid that is in contact with the substrate W is replaced with the second etching liquid, it is possible to inhibit or prevent such oxidation and to etch the etching target 96 with high precision.

In the present preferred embodiment, the recess 95, which becomes narrower toward the bottom of the recess 95, is etched with the first etching liquid and the second etching liquid. When the first etching liquid is supplied, the etching target 96 exposed on the side surface 95s of the recess 95 is uniformly etched, and when the second etching liquid is supplied, the etching amount of the etching target 96 increases as the bottom of the recess 95 is approached. After the first etching liquid and the second etching liquid are supplied, the width W1 of the recess 95 becomes uniform from the entrance of the recess 95 to the bottom of the recess 95, or the non-uniformity of the width W1 of the recess 95 is reduced. Thus, in a case where the width W1 of the recess 95 before being etched is non-uniform, it is possible to arrange the shape of the recess 95.

Polysilicon is composed of many silicon single crystals. When polysilicon is etched with alkaline etching liquid not containing the chemical compound, very fine irregularities are formed on the surface of polysilicon. This is because the (110) plane, the (100) plane and the (111) plane of silicon are exposed on the surface of the polysilicon, and the etching speeds of the (110) plane, the (100) plane and the (111) plane of silicon differ from each other. For the same reason, when a silicon single crystal is etched, very fine irregularities are formed on the surface of the silicon single crystal.

A hydroxide ion (OH⁻) in the alkaline etching liquid reacts with silicon (Si) and etches the etching target 96 such as polysilicon.

When the chemical compound is added to the alkaline etching liquid, contact between the hydroxide ion and silicon is inhibited and the etching speeds of the (110) plane, the (100) plane and the (111) plane of silicon are lowered. However, the etching speeds do not decrease uniformly at the plurality of crystal planes but decrease relatively greatly at the crystal plane among these at which the etching speed is high. Thus, the difference in etching speed among the plurality of crystal planes is lowered.

As described above, anisotropy of the etching liquid with respect to the etching target 96 such as polysilicon is lowered by adding the chemical compound to the alkaline etching liquid. That is, etching of the etching target 96 is approached to isotropic etching and the etching target 96 is etched with a uniform etching amount at every position. Thus, the dependence of the etching speed on the plane direction is mitigated. Accordingly, it is possible to suppress or prevent the generation of irregularities as described above and to flatten the surface of the etching target 96 that has been etched.

Next, a second preferred embodiment will be described.

The second preferred embodiment mainly differs from the first preferred embodiment in that a substrate processing apparatus 101 is a batch type apparatus that processes a plurality of substrates W in a batch.

Figure 11:
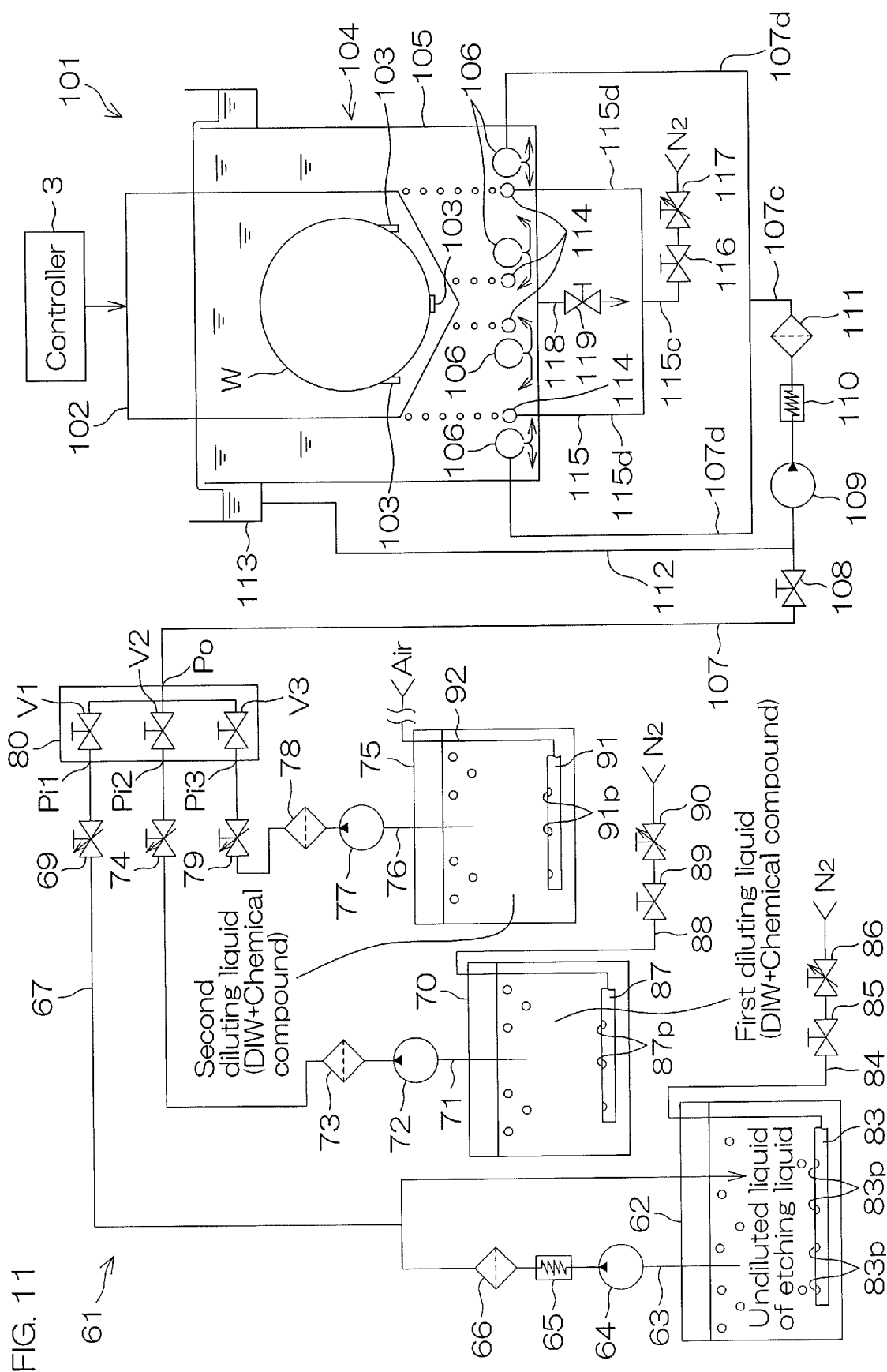
FIG. 11 is a schematic view showing an etching unit included in a substrate processing apparatus according to a second preferred embodiment of the present invention.

FIG. 11 is a schematic view showing an etching unit 104a included in a substrate processing apparatus 101 according to the second preferred embodiment of the present invention. In FIG. 11, components equivalent to the components described above and shown in FIG. 1 to FIG. 12 are designated by the same reference characters as in FIG. 1, etc., and description thereof is omitted.

The substrate processing apparatus 101 includes a plurality of processing units that process a plurality of substrates W in a batch, a transfer unit that performs a carry-in operation to carry a plurality of substrates W into the processing unit and a carry-out operation to carry out a plurality of substrates W from the processing unit, and the controller 3 that controls the substrate processing apparatus 101. The plurality of processing units include an etching unit 104 that supplies the etching liquid to a plurality of substrates W at the same time. Although not shown, the plurality of processing units further include a rinse processing unit that supplies rinse liquid to the plurality of substrates W at the same time to which the etching liquid is supplied, and a drying processing unit that dries the plurality of substrates W at the same time to which the rinse liquid is supplied.

The etching unit 104 includes an immersion bath 105 that stores the etching liquid and into which a plurality of substrates W are simultaneously carried. The transfer unit includes a holder that holds a plurality of substrates W with each substrate W in a vertical posture and a lifter 102 that raises and lowers the holder 103 between a lower position where a plurality of substrates W held by the holder 103 are immersed in the etching liquid in the immersion bath 105 and an upper position where a plurality of substrates W held by the holder 103 are positioned above the etching liquid in the immersion bath 105.

The etching unit 104 further includes a plurality of etching liquid nozzles 106 including etching liquid discharge ports to discharge the etching liquid and a plurality of gas nozzles 114 including gas discharge ports to discharge inert gas. Each of the etching liquid nozzle 106 and the gas nozzle 114 has a tubular shape horizontally extending in the immersion bath 105. The plurality of etching liquid nozzles 106 and the plurality of gas nozzles 114 are disposed parallel to each other in a horizontal posture. One or more gas nozzles 114 are disposed between two adjacent etching liquid nozzles 106. When the holder 103 is disposed at the lower position (a position shown in FIG. 11), the plurality of etching liquid nozzles 106 and the plurality of gas nozzles 114 are disposed below a plurality of substrates W held by the holder 103.

The etching liquid piping 107 is connected to the plurality of etching liquid nozzles 106. The etching liquid piping 107 includes common piping 107c that guide the etching liquid to be supplied to the plurality of etching liquid nozzles 106, and a plurality of branch pipes 107d that supply the plurality of etching liquid nozzles 106 with the etching liquid supplied from the common piping 107c. The common piping 107c is connected to the mixing valve 80. The etching liquid valve 108 is interposed in the common piping 107c. The plurality of branch pipes 107d are branched from the common piping 107c. The plurality of branch pipes 107d are connected to the plurality of etching liquid nozzles 106, respectively. In FIG. 11, it is depicted as if the branch pipes 107d are connected to only the two etching liquid nozzles 106 on both sides, but the branch pipes 107d are also connected to the other etching liquid nozzles 106.

gas piping 115 is connected to the plurality of gas nozzles 114. The gas piping 115 includes common piping 115c that guide gas to be supplied the plurality of gas nozzles 114, and a plurality of branch pipes 115d that supply the plurality of gas nozzles 114 with gas supplied from the common piping 115c. The common piping 115c is connected to an inert gas supply source. A gas valve 116 and a flow rate adjusting valve 117 are interposed in the common piping 115c. The plurality of branch pipes 115d are branched from the common piping 115c. The plurality of branch pipes 115d are connected to the plurality of gas nozzles 114, respectively. In FIG. 11, it is depicted as if the branch pipes 115d are connected to only the two gas nozzles 114 on both sides, but the branch pipes 115d are also connected to the other gas nozzles 114.

The etching unit 104 includes an overflow bath 113 that receives the etching liquid overflowing from the immersion bath 105. The upstream end of return piping 112 is connected to the overflow bath 113, and the downstream end of the return piping 112 is connected to the common piping 107c of the etching liquid piping 107 at a position downstream of the etching liquid valve 108. The etching liquid overflowing from the immersion bath 105 to the overflow bath 113 is sent to the plurality of etching liquid nozzles 106 again by a pump 109 and filtered by a filter 111 before reaching the plurality of etching liquid nozzles 106. The etching unit 104 may include a temperature controller 110 that changes the temperature of the etching liquid in the immersion bath 105 by heating or cooling the etching liquid.

When the plurality of etching liquid nozzles 106 discharge the etching liquid, the etching liquid is supplied to the inside of the immersion bath 105, an upward flow of the etching liquid is formed within the immersion bath 103. The etching liquid overflowing from an opening provided in an upper end of the immersion bath 105 is received by the overflow bath 113 and returned to the plurality of etching liquid nozzles 106 via the return piping 112. Thus, the etching liquid circulates. On the other side, a drainage valve 119 interposed in the drainage piping 118 is opened, liquid in the immersion bath 105 such as the etching liquid is discharged to the drainage piping 118.

When the alkaline first etching liquid and the second etching liquid having different dissolved oxygen concentrations are supplied to a plurality of substrates W held by the holder 103, the first etching liquid is supplied to the immersion bath 105 via the plurality of etching liquid nozzles 106 in a state where the drainage valve 119 is closed. When a predetermined time has elapsed since the supply of the first etching liquid is started, the drainage valve 119 is opened and the first etching liquid in the immersion bath 105 is discharged. After that, the second etching liquid is supplied to the immersion bath 105 via the plurality of etching liquid nozzles 106 in a state where the drainage valve 119 is closed.

The first etching liquid and the second etching liquid may be mixed inside the immersion bath 105. For example, after a predetermined time has elapsed since the supply of the first etching liquid is started, the supply of the first etching liquid may be stopped and then the supply of the second etching liquid may be started. In this case, the first etching liquid and the second etching liquid are mixed at the immersion bath 105, and the dissolved oxygen concentration of the etching liquid to be supplied the substrate W is changed.

Instead of sequentially supplying the first etching liquid and the second etching liquid to one immersion bath 105, the immersion bath 105 storing the first etching liquid and the immersion bath 105 storing the second etching liquid may be provided and a plurality of substrates W constituting one batch may be sequentially carried into the two immersion baths 105. By doing so, it is possible to omit the replacement of the etching liquid to change the first etching liquid in the immersion bath 105 to the second etching liquid.

Other Preferred Embodiments

The present invention is not restricted to the contents of the preferred embodiments described above and various modifications are possible.

For example, in the first preferred embodiment, the etching liquid may be supplied not to the upper surface of the substrate W but to the lower surface of the substrate W. Alternatively, the etching liquid may be supplied to both the upper surface and the lower surface of the substrate W. In these cases, the lower surface nozzle 15 may discharge the etching liquid.

In the first preferred embodiment, the first etching liquid and the second etching liquid may be discharged from separate nozzles. Alternatively, at least two of the undiluted liquid of the undiluted liquid of the etching liquid, the first diluting liquid and the second diluting liquid may be discharged from separate nozzles and mixed at a space between the upper surface of the substrate W and a nozzle.

In the first preferred embodiment, a first etching liquid tank that stores the first etching liquid and a second etching liquid tank that stores the second etching liquid may be provided. In this case, the first etching liquid and the second etching liquid may be discharged toward the substrate W from the same nozzle, or may be discharged toward the substrate W from separate nozzles.

In the first preferred embodiment, instead of replacing the first etching liquid on the substrate W with the second etching liquid, the first etching liquid on the substrate W may be replaced with liquid (intermediate liquid) other than the second etching liquid, and then the intermediate liquid on the substrate W may be replaced with the second etching liquid. Alternatively, two or more liquids may be sequentially supplied to the substrate W between the supply of the first etching liquid and the supply of the second etching liquid. For example, the first etching liquid on the substrate W may be replaced with first intermediate liquid, the first intermediate liquid on the substrate W may be replaced with second intermediate liquid, and the second intermediate liquid on the substrate W may be replaced with the second etching liquid.

In the first preferred embodiment and the second preferred embodiment, the first etching liquid may be supplied to the substrate W after the second etching liquid is supplied to the substrate W. In this case, the second etching liquid and the first etching liquid may be continuously supplied to the substrate W, or a liquid other than the first etching liquid may be supplied to the substrate W before the first etching liquid is supplied.

In the first preferred embodiment and the second preferred embodiment, the chemical compound contained in the first etching liquid may be different from the chemical compound contained in the second etching liquid.

In the first preferred embodiment and the second preferred embodiment, at least one of the first etching liquid and the second etching liquid may be the above-described alkaline etching liquid not containing the chemical compound. In this case, before or after the alkaline etching liquid not containing the chemical compound is supplied to the substrate W, the above-described chemical compound may be mixed with the etching liquid. For example, the alkaline etching liquid not containing the chemical compound and chemical-compound-containing liquid containing the chemical compound may be mixed at the front surface or the rear surface of the substrate W.

The tubular portion 37 may be omitted from the shielding member 33. The upper support portions 43 and the lower support portions 44 may be omitted from the shielding member 33 and spin chuck 10.

The shielding member 33 may be omitted from the processing unit 2. In this case, the processing unit 2 may include a nozzle that discharges the processing liquid such as the chemical liquid toward the substrate W. The nozzle may be a scan nozzle that is horizontally movable in the chamber 4, or may be a fixed nozzle that is fixed with respect to the partition wall 6 of the chamber 4. The nozzle may include a plurality of liquid discharge ports that supply the processing liquid to the upper surface or the lower surface of the substrate W by simultaneously discharging the processing liquid toward a plurality of positions away in the radial direction of the substrate W. In this case, at least one of the flow rate, the temperature and the concentration of the processing liquid to be discharged may be changed for each of the liquid discharge ports.

The substrate processing apparatus 1 is not restricted to an apparatus to process a disc-shaped substrate W, and may be an apparatus to process a polygonal substrate W.

Two or more arrangements among all the arrangements described above may be combined. Two or more steps among all the steps described above may be combined.

The preferred embodiments of the present invention are described in detail above, however, these are just detailed examples used for clarifying the technical contents of the present invention, and the present invention should not be limitedly interpreted to these detailed examples, and the spirit and scope of the present invention should be limited only by the claims appended hereto.

REFERENCE SIGNS LIST

1: substrate processing apparatus
61: processing liquid supplying unit (the first and the second etching unit)
95: the recess
95s: the side surface of the recess
96: the etching target
D1: of the recess の the depth
W: substrate
W1: the width of the recess

What is claimed is:

1. A substrate processing method comprising:
   etching an etching target exposed on a side surface of a recess by supplying alkaline first etching liquid in which inert gas is dissolved to a substrate on which the recess is formed, the recess having a width shorter than a depth of the recess, the recess including the etching target that represents at least one of silicon single crystal, polysilicon and amorphous silicon and that is exposed on at least a portion of an upper portion of the side surface of the recess and at least a portion of a lower portion of the side surface; and
   etching the etching target exposed on the side surface of the recess by supplying the substrate with alkaline second etching liquid in which dissolution gas is dissolved and having dissolved oxygen concentration higher than that of the first etching liquid wherein
   the width of the recess before the first etching liquid and the second etching liquid are supplied decreases as a bottom of the recess is approached, and
   in etching the etching target exposed on the side surface of the recess by supplying the substrate with the second etching liquid, an etching amount of the side surface of the recess increases as the bottom of the recess is approached.

2. The substrate processing method according to claim 1, wherein etching the etching target exposed on the side surface of the recess by supplying the substrate with the second etching liquid is etching the etching target exposed on the side surface of the recess by supplying the substrate with the second etching liquid after etching the etching target exposed on the side surface of the recess by supplying the first etching liquid to the substrate.

3. The substrate processing method according to claim 2, wherein in etching the etching target exposed on the side surface of the recess by supplying the substrate with the second etching liquid, the first etching liquid that is in contact with the substrate is replaced with the second etching liquid by supplying the second etching liquid to the substrate.

4. The substrate processing method according to claim 1, wherein
   in etching by supplying the substrate with the first etching liquid, the first etching liquid is made by diluting alkaline undiluted liquid of the etching liquid with at least one of first diluting liquid and second diluting liquid having different dissolved oxygen concentrations, and
   in etching by supplying the substrate with the second etching liquid, the second etching liquid is made by diluting the undiluted liquid with at least one of the first diluting liquid and the second diluting liquid.

5. The substrate processing method according to claim 1, wherein the substrate processing method processes a plurality of substrates one by one.

6. The substrate processing method according to claim 1, wherein the substrate processing method processes a plurality of substrates in a batch.

\* \* \* \* \*